(12) United States Patent
Bae et al.

(10) Patent No.: US 11,575,014 B2
(45) Date of Patent: Feb. 7, 2023

(54) SEMICONDUCTOR DEVICE AND METHOD FOR FABRICATING THE SAME

(71) Applicant: Samsung Electronics Co., Ltd., Suwon-si (KR)

(72) Inventors: Deok Han Bae, Suwon-si (KR); Sung Min Kim, Hwaseong-si (KR); Ju Hun Park, Seoul (KR); Myung Yoon Um, Seoul (KR); Jong Mil Youn, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1 day.

(21) Appl. No.: 17/227,848

(22) Filed: Apr. 12, 2021

(65) Prior Publication Data
US 2022/0077292 A1    Mar. 10, 2022

(30) Foreign Application Priority Data
Sep. 9, 2020   (KR) .......................... 10-2020-0115152

(51) Int. Cl.
*H01L 29/417* (2006.01)
*H01L 29/40* (2006.01)
*H01L 29/06* (2006.01)
*H01L 29/66* (2006.01)

(52) U.S. Cl.
CPC .... *H01L 29/41775* (2013.01); *H01L 29/0673* (2013.01); *H01L 29/401* (2013.01); *H01L 29/66545* (2013.01)

(58) Field of Classification Search
CPC ......... H01L 29/66545; H01L 29/41775; H01L 29/401
See application file for complete search history.

(56) References Cited

U.S. PATENT DOCUMENTS

| | | | |
|---|---|---|---|
| 10,157,790 B1 * | 12/2018 | You | H01L 21/76847 |
| 10,163,704 B2 | 12/2018 | Chen et al. | |
| 10,522,537 B2 | 12/2019 | Kim et al. | |
| 11,069,784 B2 * | 7/2021 | Tsai | H01L 21/76849 |
| 2019/0123163 A1 * | 4/2019 | Yang | H01L 21/02603 |
| 2019/0385946 A1 | 12/2019 | Xie et al. | |
| 2020/0020776 A1 | 1/2020 | Yang et al. | |
| 2020/0035558 A1 | 1/2020 | Ching et al. | |
| 2020/0126843 A1 | 4/2020 | Tsai et al. | |
| 2021/0305427 A1 | 9/2021 | Bae et al. | |

* cited by examiner

*Primary Examiner* — Changhyun Yi
(74) *Attorney, Agent, or Firm* — Harness, Dickey & Pierce, P.L.C.

(57) ABSTRACT

A semiconductor device is provided. The semiconductor device includes a substrate comprising an element isolation region and an active region defined by the element isolation region, a fin-type pattern on the active region, the fin-type pattern extending in a first horizontal direction, a gate electrode on the fin-type pattern, the gate electrode extending in a second horizontal direction that crosses the first horizontal direction, a capping pattern on the gate electrode, a source/drain region on at least one side of the gate electrode, a source/drain contact on the source/drain region and electrically connected to the source/drain region, and a filling insulating layer on the source/drain contact, the filling insulating layer having a top surface at a same level as a top surface of the capping pattern, and including a material containing a carbon (C) atom.

19 Claims, 31 Drawing Sheets

SEMICONDUCTOR DEVICE AND METHOD FOR FABRICATING THE SAME

CROSS-REFERENCE TO RELATED APPLICATION

This application claims priority from Korean Patent Application No. 10-2020-0115152 filed on Sep. 9, 2020 in the Korean Intellectual Property Office, and all the benefits accruing therefrom under 35 U.S.C. § 119, the contents of which in its entirety are herein incorporated by reference.

BACKGROUND

Inventive concepts relate to a semiconductor device and/or a method for fabricating the same.

With the recent rapid spread of information media, the functions of semiconductor devices have also rapidly developed. In the case of recent semiconductor products, high integration of the products is required for low cost and high quality in order to gain a competitive edge. For high integration, semiconductor devices have been scaled down in size.

Meanwhile, as pitches and/or feature sizes decreases, there is a desire for research to decrease capacitance and/or to secure electrical stability between contacts in the semiconductor device.

SUMMARY

Some example embodiments of inventive concepts provide a semiconductor device and/or a method for fabricating the same, in which a top surface of a capping pattern in an active region is formed on substantially the same plane as a top surface of a capping pattern in an element isolation region by reducing or minimizing etching of the capping pattern in the active region in a process of forming a source/drain contact. Accordingly, in the semiconductor device and/or the method for fabricating the same, the degree of difficulty in a process for forming a gate contact may be decreased.

According to some example embodiments of inventive concepts, there is provided a semiconductor device, comprising a substrate comprising an element isolation region and an active region defined by the element isolation region, a fin-type pattern on the active region, the fin-type pattern extending in a first horizontal direction, a gate electrode on the fin-type pattern, the gate electrode extending in a second horizontal direction that crosses the first horizontal direction, a capping pattern on the gate electrode, a source/drain region on at least one side of the gate electrode, a source/drain contact on the source/drain region and electrically connected to the source/drain region, and a filling insulating layer on the source/drain contact, the filling insulating layer having a top surface at a same level as a top surface of the capping pattern, and including a material containing a carbon (C) atom.

According to some example embodiments of inventive concepts, there is provided a method for fabricating a semiconductor device, comprising forming, on a substrate, an active region extending in a first horizontal direction and an element isolation region defining the active region, forming, on the substrate, a dummy gate extending in a second horizontal direction that crosses the first horizontal direction, forming a source/drain region on at least one side of the dummy gate, forming a first interlayer insulating layer surrounding a sidewall of the dummy gate, forming a gate trench by removing the dummy gate, sequentially forming, in the gate trench, a gate electrode and a capping pattern, forming a contact trench on the active region to penetrate the first interlayer insulating layer in a vertical direction and to expose the source/drain region, forming a contact structure to fill the contact trench, forming a source/drain contact comprising a first portion and a second portion, the second portion protruding in the vertical direction from the first portion, the forming the source/drain contact including etching a part of the contact structure, and forming a filling insulating layer to completely fill the contact trench, the filling insulating layer including a material different from that of the first interlayer insulating layer. A top surface of the filling insulating layer is at a same level as a top surface of the capping pattern.

According to some example embodiments of inventive concepts, there is provided a method for fabricating a semiconductor device, comprising forming, on a substrate, an active region extending in a first horizontal direction and an element isolation region defining the active region, forming, on the substrate, a dummy gate extending in a second horizontal direction that crosses the first horizontal direction, forming a source/drain region on at least one side of the dummy gate, forming a first interlayer insulating layer surrounding a sidewall of the dummy gate, forming a gate trench by removing the dummy gate, sequentially forming a gate electrode in the gate trench and a capping pattern in the gate trench, forming, on the active region, a contact trench to penetrate the first interlayer insulating layer in a vertical direction and to expose the source/drain region, forming a contact structure to fill the contact trench, forming a source/drain contact comprising a first portion and a second portion protruding in the vertical direction from the first portion by etching a part of the contact structure, forming a filling insulating layer in the contact trench and on a top surface of the capping pattern, etching the filling insulating layer through a first planarization process to expose the capping pattern, forming a second interlayer insulating layer on the capping pattern and on the filling insulating layer, forming, on the active region, a gate contact to penetrate the second interlayer insulating layer and the capping pattern in the vertical direction, and etching a part of the gate contact and the second interlayer insulating layer through a second planarization process to expose the capping pattern. The filling insulating layer includes a material containing a carbon (C) atom, and a top surface of the filling insulating layer is at a same level as each of the top surface of the capping pattern and a top surface of the first interlayer insulating layer.

However, aspects of inventive concepts are not restricted to the one set forth herein. The above and other aspects of inventive concepts will become more apparent to one of ordinary skill in the art to which inventive concepts pertains by referencing the detailed description of inventive concepts given below.

BRIEF DESCRIPTION OF THE DRAWINGS

The above and other aspects and features of inventive concepts will become more apparent by describing in detail some example embodiments thereof with reference to the attached drawings, in which.

DETAILED DESCRIPTION OF SOME EXAMPLE EMBODIMENTS

Although the drawings relating to a semiconductor device according to some example embodiments of inventive concepts illustratively show a fin-type transistor (FinFET) comprising a channel region having a fin-type pattern, and/or a transistor comprising nanowires or nanosheets, inventive concepts are not limited thereto. The semiconductor device according to some example embodiments may comprise a tunneling field effect transistor (TFET) and/or a three-dimensional (3D) transistor. Alternatively or additionally semiconductor device according to some example embodiments may comprise a planar transistor. Alternatively or additionally, the semiconductor device according to some example embodiments may comprise at least one of bipolar junction transistor, a lateral double-diffused MOSFET (LDMOS), and/or the like.

Hereinafter, a semiconductor device according to some example embodiments of inventive concepts will be described with reference to FIGS. 1 to 6.

Figure 1:
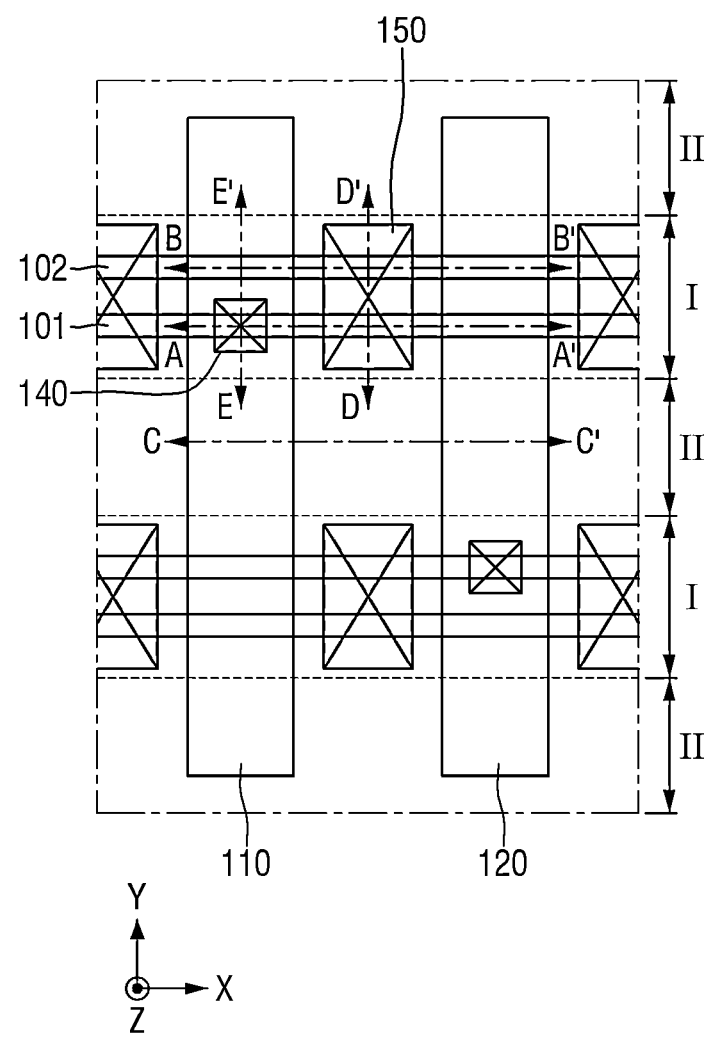
FIG. 1 is a layout diagram illustrating a semiconductor device according to some example embodiments of inventive concepts.
Figure 2:
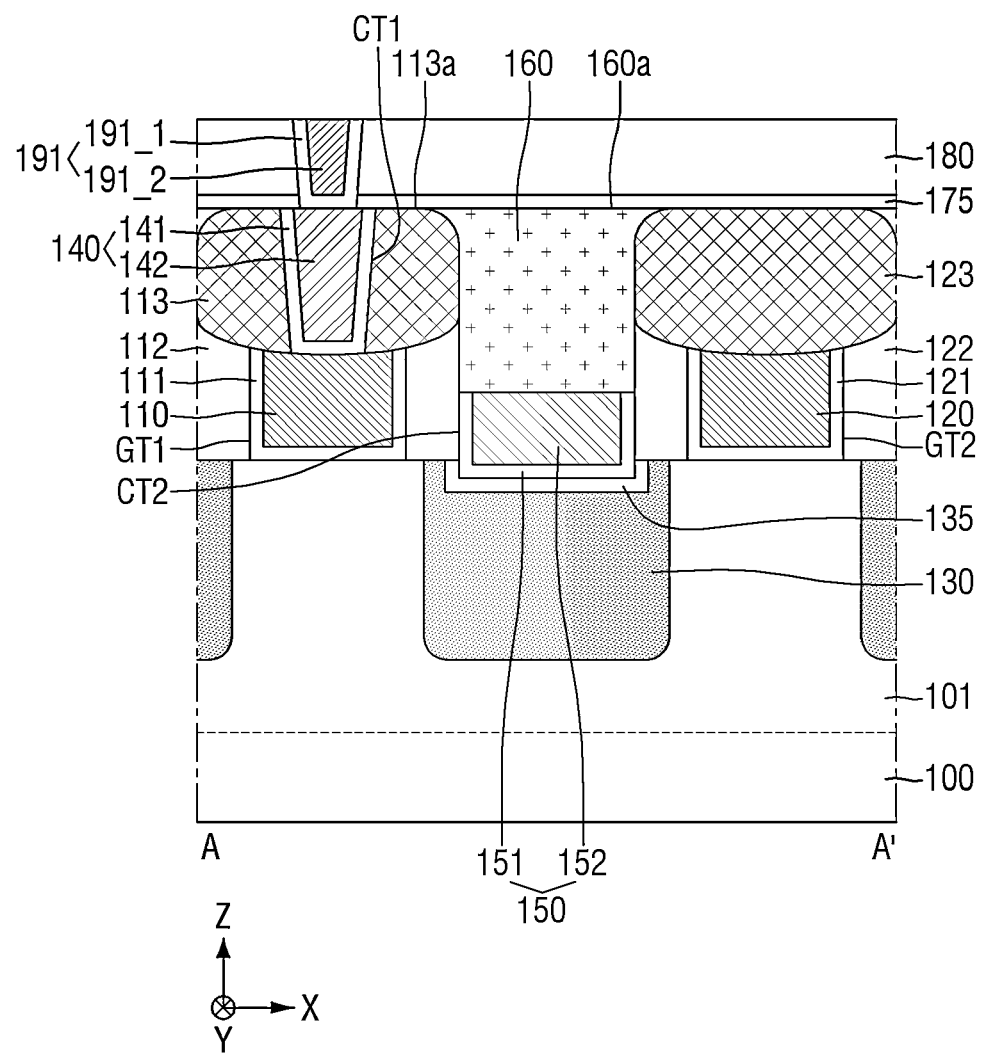
FIG. 2 is a cross-sectional view taken along line A-A' of FIG. 1.
Figure 3:
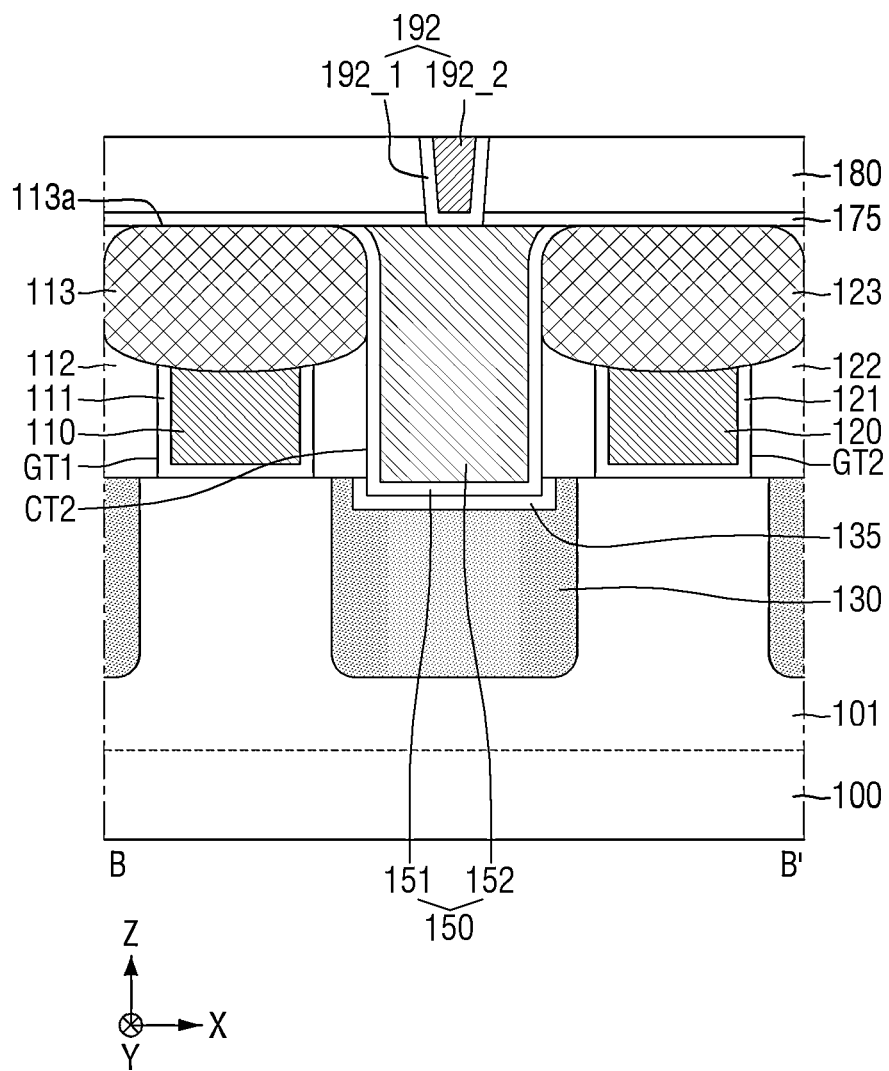
FIG. 3 is a cross-sectional view taken along line B-B' of FIG. 1.
Figure 4:
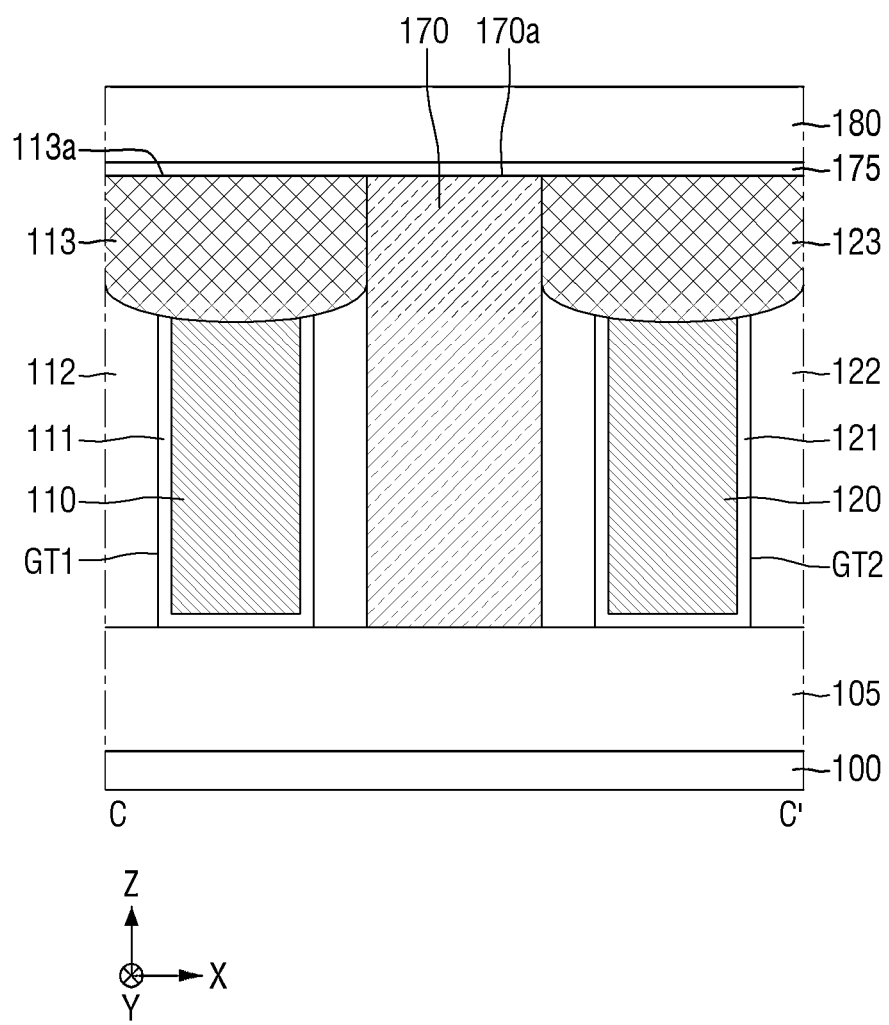
FIG. 4 is a cross-sectional view taken along line C-C' of FIG. 1.
Figure 5:
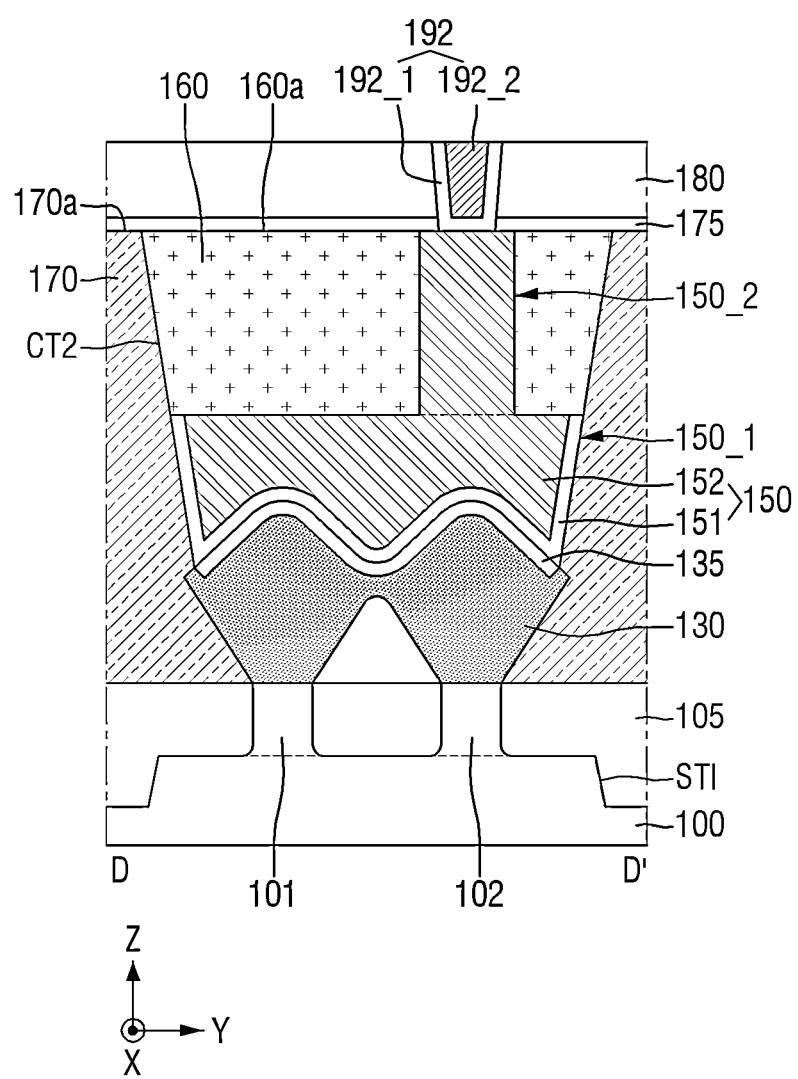
FIG. 5 is a cross-sectional view taken along line D-D' of FIG. 1.
Figure 6:
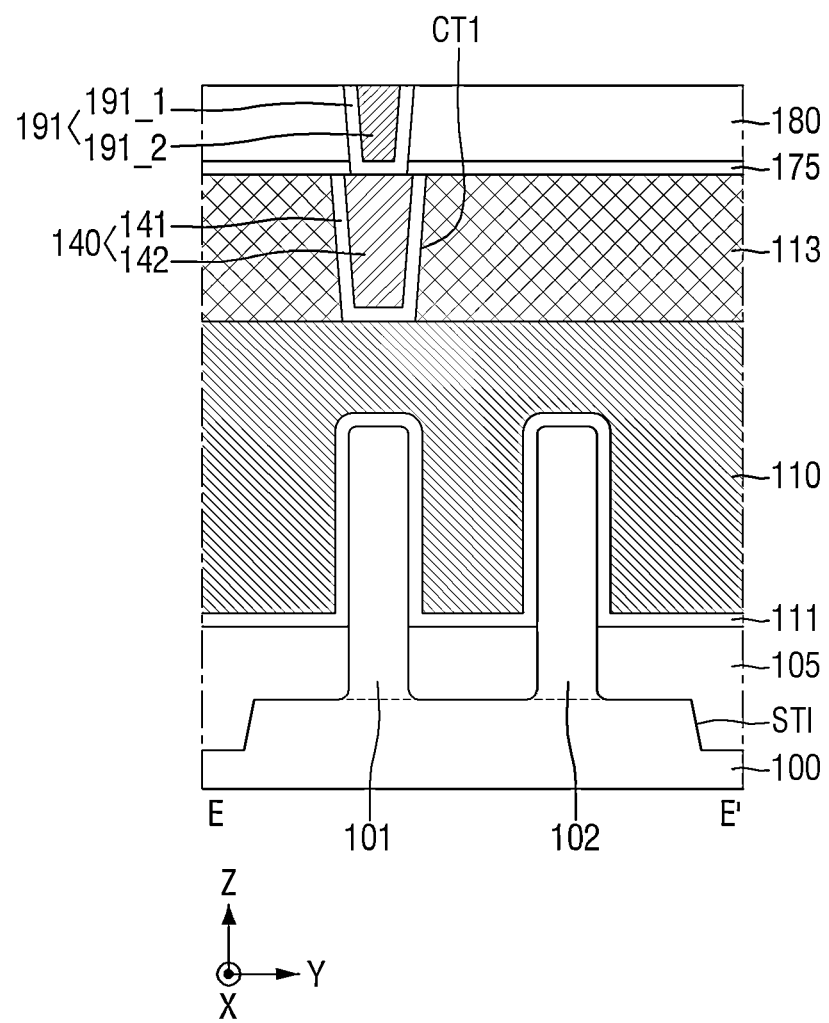
FIG. 6 is a cross-sectional view taken along line E-E' of FIG. 1.

FIG. 1 is a layout diagram illustrating a semiconductor device according to some example embodiments of inventive concepts. FIG. 2 is a cross-sectional view taken along line A-A' of FIG. 1. FIG. 3 is a cross-sectional view taken along line B-B' of FIG. 1. FIG. 4 is a cross-sectional view taken along line C-C' of FIG. 1. FIG. 5 is a cross-sectional view taken along line D-D' of FIG. 1. FIG. 6 is a cross-sectional view taken along line E-E' of FIG. 1.

Referring to FIGS. 1 to 6, a semiconductor device according to some embodiments of inventive concepts comprises a substrate 100, a field insulating layer 105, a first fin-type pattern 101, a second fin-type pattern 102, and a first gate structure (to be described below), a second gate structure (to be described below), a source/drain region 130, a silicide layer 135, a gate contact 140, a source/drain contact 150, a filling insulating layer 160, a first interlayer insulating layer 170, an etch stop layer 175, a second interlayer insulating layer 180, a first via 191, and a second via 192.

The substrate 100 may comprise an element isolation region II and an active region I defined by the element isolation region II. For example, as shown in FIG. 1, each of two active regions I may extend in a first horizontal direction X. The active regions I may be spaced apart from each other in a second horizontal direction Y crossing the first horizontal direction X. The second direction Y may cross the first direction X at a right angle; however, example embodiments are not limited thereto. The element isolation regions II may be disposed on both sides of the active region I. The arrangement of the active regions I and the element isolation regions II is illustrative of examples only, and the active regions I and the element isolation regions II may be arranged in a different manner in some other example embodiments.

The substrate 100 may be or may include a wafer, and may be or may include a silicon substrate or silicon-on-insulator (SOI) substrate. Alternatively, the substrate 100 may include silicon germanium, silicon germanium on insulator (SGOI), indium antimonide, a lead tellurium compound, indium arsenide, indium phosphide, gallium arsenide, or gallium antimonide, but inventive concepts are not limited thereto. Alternatively or additionally, the substrate 100 may be doped, e.g. may be lightly doped with impurities such as boron (B), arsenic (As), or phosphorus (P); however, example embodiments are not limited thereto.

Each of the first fin-type pattern 101 and the second fin-type pattern 102 may be disposed in the active region I. Each of the first fin-type pattern 101 and the second fin-type pattern 102 may extend in the first horizontal direction X. Each of the first fin-type pattern 101 and the second fin-type pattern 102 may protrude from the substrate 100 in the vertical direction Z.

FIG. 1 illustrates that two fin-type patterns 101 and 102 are disposed in one active region I. However, this is merely for simplicity of description and inventive concepts are not limited thereto. One or more fin-type patterns may be disposed in one active region I.

Each of the first fin-type pattern 101 and the second fin-type pattern 102 may be a part of the substrate 100 and may comprise a homogeneous or heterogeneous epitaxial layer grown from the substrate 100. Each of the first fin-type pattern 101 and the second fin-type pattern 102 may include, for example, homogenous silicon or homogenous germanium, which are elemental semiconductor material. Alternatively, each of the first fin-type pattern 101 and the second fin-type pattern 102 may include a compound semiconductor, for example, a group IV-IV compound semiconductor and/or a group III-V compound semiconductor.

The group IV-IV compound semiconductor may be a binary compound or a ternary compound including at least two of carbon (C), silicon (Si), germanium (Ge) and tin (Sn), or the above-mentioned compound doped with a group IV element. The group III-V compound semiconductor may be, for example, a binary compound, a ternary compound or a quaternary compound formed by combining at least one of aluminum (Al), gallium (Ga) and indium (In) which are group III elements with one of phosphorus (P), arsenic (As) and antimony (Sb) which are group V elements.

The field insulating layer 105 may be disposed on the substrate 100. The field insulating layer 105 may be disposed over the active region I and the element isolation region II. The field insulating layer 105 may fill an element isolation trench STI defining the active region I.

The field insulating layer 105 may be disposed on a part of the sidewall of the first fin-type pattern 101 and a part of the sidewall of the second fin-type pattern 102. Each of the first fin-type pattern 101 and the second fin-type pattern 102 may protrude in the vertical direction Z compared to the top surface of the field insulating layer 105. The field insulating layer 105 may include, for example, an oxide layer such as a silicon oxide layer, a nitride layer such as a silicon nitride layer, an oxynitride layer such as a silicon oxynitride layer, or a combination layer thereof.

The first gate structure may comprise a first gate electrode 110, a first gate insulating layer 111, a first gate spacer 112, and a first capping pattern 113. The second gate structure may comprise a second gate electrode 120, a second gate insulating layer 121, a second gate spacer 122, and a second capping pattern 123.

Each of the first gate structure and the second gate structure may extend in the second horizontal direction Y crossing the first horizontal direction X in the active region I and the element isolation region II. The second gate structure may be spaced apart from the first gate structure in the first horizontal direction X.

The first gate electrode 110 may be disposed in a first gate trench GT1 defined by the first gate spacers 112. The first gate electrode 110 may extend in the second horizontal direction Y. The first gate electrode 110 may be disposed on the first fin-type pattern 101, the second fin-type pattern 102, and the field insulating layer 105. The first gate electrode 110 may intersect the first fin-type pattern 101 and the second fin-type pattern 102.

Although the figures, for example FIG. 1, illustrate the first gate electrode 110 is disposed over the two active regions I, this is merely for simplicity of description and example embodiments are not limited thereto. In some other example embodiments, the first gate electrode 110 may be divided, e.g. cut, into two parts (or two collinear parts) to be disposed in two active regions I, respectively.

The second gate electrode 120 may be disposed in a second gate trench GT2 defined by the second gate spacers 122. The second gate electrode 120 may extend in the second horizontal direction Y. The second gate electrode 120 may be disposed on the first fin-type pattern 101, the second fin-type pattern 102, and the field insulating layer 105. The second gate electrode 120 may intersect the first fin-type pattern 101 and the second fin-type pattern 102.

Although the figures such as FIG. 1 illustrate that the second gate electrode 120 is disposed over the two active regions I, this is merely for simplicity of description and example embodiments are not limited thereto. In some other example embodiments, the second gate electrode 120 may be divided, e.g. cut, into two parts (or two collinear parts) to be disposed respectively in two active regions I.

Each of the first gate electrode 110 and the second gate electrode 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and a combination thereof. Each of the first gate electrode 110 and the second gate electrode 120 may include conductive metal oxide, conductive metal oxynitride, and/or the like, and may include an oxidized form of the aforementioned material.

The first gate insulating layer 111 may be disposed in the first gate trench GT1 along the sidewall and bottom surface of the first gate trench GT1, e.g. may be conformal to the first gate trench GT1. The first gate electrode 110 may fill the inside of the first gate trench GT1, on the first gate insulating layer 111.

The second gate insulating layer 121 may be disposed in the second gate trench GT2 along the sidewall and bottom surface of the second gate trench GT2, e.g. may be conformal to the second gate trench GT2. The second gate electrode 120 may fill the inside of the second gate trench GT2, on the second gate insulating layer 121.

Each of the first gate insulating layer 111 and the second gate insulating layer 121 may include silicon oxide, silicon oxynitride, silicon nitride, or a high dielectric constant material having a dielectric constant greater than that of silicon oxide. The high dielectric constant material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate.

A semiconductor device according to some other example embodiments may comprise a negative capacitance field effect transistor (NCFET) using a negative capacitor. For example, each of the first gate insulating layer 111 and the second gate insulating layer 121 may comprise a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series and the capacitance of each capacitor has a positive value, the total capacitance becomes less than the capacitance of each capacitor. On the other hand, when at least one of the capacitances of two or more capacitors connected in series has a negative value, the total capacitance may have a positive value and may be greater than the absolute value of each capacitance.

When a ferroelectric material layer having a negative capacitance and a paraelectric material layer having a positive capacitance are connected in series, the total capacitance value of the ferroelectric material layer and the paraelectric material layer connected in series may increase. By using an increase in the total capacitance value, the transistor comprising the ferroelectric material layer may have a subthreshold swing (SS) less than 60 mV/decade at room temperature.

The ferroelectric material layer may have ferroelectric properties. The ferroelectric material layer may include, for example, at least one of hafnium oxide, hafnium zirconium oxide, barium strontium titanium oxide, barium titanium oxide, or lead zirconium titanium oxide. In this case, as one example embodiment, the hafnium zirconium oxide may be a material containing hafnium oxide doped with zirconium (Zr). As another example embodiment, the hafnium zirconium oxide may be a compound of hafnium (Hf), zirconium (Zr), and oxygen (O).

The ferroelectric material layer may further include an impurity, e.g. a dopant doped therein. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant comprised in the ferroelectric material layer may vary depending on which ferroelectric material is comprised in the ferroelectric material layer.

When the ferroelectric material layer includes hafnium oxide, the dopant included in the ferroelectric material layer may include, for example, at least one of gadolinium (Gd), silicon (Si), zirconium (Zr), aluminum (Al), or yttrium (Y).

When the dopant is aluminum (Al), the ferroelectric material layer may include 3 to 8 atomic percent (at %) of aluminum. In this case, the ratio of the dopant may be a ratio of aluminum to the sum of hafnium and aluminum.

When the dopant is silicon (Si), the ferroelectric material layer may include 2 to 10 at % of silicon. When the dopant is yttrium (Y), the ferroelectric material layer may include 2 to 10 at % of yttrium. When the dopant is gadolinium (Gd), the ferroelectric material layer may include 1 to 7 at % of gadolinium. When the dopant is zirconium (Zr), the ferroelectric material layer may include 50 to 80 at % of zirconium.

The paraelectric material layer may have paraelectric properties. The paraelectric material layer may include, for example, at least one of silicon oxide or metal oxide having a high dielectric constant. The metal oxide included in the paraelectric material layer may include, for example, at least one of hafnium oxide, zirconium oxide, or aluminum oxide, but is not limited thereto.

The ferroelectric material layer and the paraelectric material layer may include the same material. The ferroelectric material layer may have ferroelectric properties, but the paraelectric material layer may not have ferroelectric properties. For example, when the ferroelectric material layer and the paraelectric material layer include hafnium oxide, the crystal structure of the hafnium oxide included in the ferroelectric material layer is different from the crystal structure of the hafnium oxide included in the paraelectric material layer.

The ferroelectric material layer may have a thickness that exhibits ferroelectric properties. The thickness of the ferroelectric material layer may be, for example, in a range of 0.5 to 10 nm, but is not limited thereto. Since a critical thickness at which each ferroelectric material exhibits ferroelectric properties may be different, the thickness of the ferroelectric material layer may vary depending on the ferroelectric material.

As one example embodiment, each of the first gate insulating layer 111 and the second gate insulating layer 121 may comprise one ferroelectric material layer. As another example embodiment, each of the first gate insulating layer 111 and the second gate insulating layer 121 may comprise a plurality of ferroelectric material layers spaced apart from each other. Each of the first gate insulating layer 111 and the second gate insulating layer 121 may have a stacked layer structure in which a plurality of ferroelectric material layers and a plurality of paraelectric material layers are alternately stacked.

The first gate spacers 112 may extend along both sidewalls of the first gate electrode 110 in the second horizontal direction Y. The first gate spacers 112 may define the first gate trench GT1. The second gate spacers 122 may extend along both sidewalls of the second gate electrode 120 in the second horizontal direction Y. The second gate spacers 122 may define the second gate trench GT2.

Each of the first gate spacer 112 and the second gate spacer 122 may include, for example, at least one of silicon nitride (SiN), silicon oxynitride (SiON), silicon oxide (SiO$_2$), silicon oxynitride (SiOCN), silicon boron nitride (SiBN), silicon oxyboron nitride (SiOBN), silicon oxycarbide (SiOC), or a combination thereof.

The first capping pattern 113 may extend in the second horizontal direction Y on the first gate electrode 110, the first gate insulating layer 111, and the first gate spacers 112. The bottom surface of the first capping pattern 113 may be formed to be convex toward the first gate electrode 110, e.g. may have a bowl shape with respect to a top surface of the substrate 100. However, inventive concepts are not limited thereto.

A top surface 113a of the first capping pattern 113 may be in contact with the etch stop layer 175. The top surface 113a of the first capping pattern 113 may have partially curved sides, but inventive concepts are not limited thereto.

The top surface 113a of the first capping pattern 113 that is disposed in the active region I may be formed at a same level as, e.g. on the same plane as, the top surface 113a of the first capping pattern 113 disposed in the element isolation region II. For example, the top surface 113a of the first capping pattern 113 disposed on the first fin-type pattern 101 may be formed at a same level as, e.g. on the same plane as the top surface 113a of the first capping pattern 113 disposed on the field insulating layer 105.

The second capping pattern 123 may extend in the second horizontal direction Y on the second gate electrode 120, the second gate insulating layer 121, and the second gate spacers 122. The bottom surface of the second capping pattern 123 may be formed to be convex toward the second gate electrode 120, e.g. may have a bowl shape with respect to the surface of the substrate 100. However, inventive concepts are not limited thereto.

The top surface of the second capping pattern 123 may be in contact with the etch stop layer 175. The top surface of the second capping pattern 123 may have partially curved sides, but inventive concepts are not limited thereto.

The top surface of the second capping pattern 123 disposed in the active region I may be formed on the same plane as the top surface of the second capping pattern 123 disposed in the element isolation region II. For example, the top surface of the second capping pattern 123 disposed on the first fin-type pattern 101 may be formed on the same plane as the top surface of the second capping pattern 123 disposed on the field insulating layer 105.

Each of the first capping pattern 113 and the second capping pattern 123 may include, for example, at least one of silicon nitride (SiN), silicon oxynitride (SiON), silicon oxide (SiO$_2$), silicon carbonitride (SiCN), silicon oxycarbonitride (SiOCN), or a combination thereof.

The source/drain region 130 may be disposed on the first fin-type pattern 101 and the second fin-type pattern 102 in the active region I. The source/drain regions 130 may be disposed on both sides of each of the first gate electrode 110 and the second gate electrode 120. However, inventive concepts are not limited thereto. In some other example embodiments, the source/drain region 130 may be disposed on at least one side of the first gate electrode 110. Alternatively or additionally, the source/drain region 130 may be disposed on at least one side of the second gate electrode 120.

The source/drain region 130 may comprise an epitaxial pattern such as a heterogeneous or homogeneous epitaxial pattern. The source/drain region 130 may be included in, or correspond to, a source/drain of a transistor using each of the first fin-type pattern 101 and the second fin-type pattern 102 as a channel region.

FIG. 5 shows the source/drain region 130 that comprises two epitaxial patterns disposed on the respective first fin-type pattern 101 and second fin-type pattern 102 and merged. However, this is merely for simplicity of description, and inventive concepts are not limited thereto. In some other example embodiments, the epitaxial patterns disposed on the respective first fin-type pattern 101 and second fin-type pattern 102 may be separated from each other.

Referring now to FIG. 6, the gate contact 140 may be disposed on the first gate electrode 110 in the active region I, for example. However, inventive concepts are not limited thereto. In some other example embodiments, the gate contact 140 may be disposed on the first gate electrode 110 in the element isolation region II.

The gate contact 140 may be disposed in a first contact trench CT1 penetrating the first capping pattern 113 in the vertical direction Z. The gate contact 140 may be in contact with the first gate electrode 110. The gate contact 140 may be electrically connected to the first gate electrode 110.

The top surface of the gate contact 140 may be formed, for example, at a same level as or on the same plane as the top surface 113a of the first capping pattern 113. The sidewalls of the gate contact 140 may be completely surrounded by the first capping pattern 113. For example, the gate contact 140 is not in contact with the filling insulating layer 160 and the first interlayer insulating layer 170, which will be described later.

The gate contact 140 may comprise a first contact barrier layer 141 and a first contact filling layer 142. The first contact barrier layer 141 may be disposed along the sidewall and the bottom surface of the first contact trench CT1. The first contact filling layer 142 may fill the first contact trench CT1, on the first contact barrier layer 141.

The first contact barrier layer 141 may include at least one of, for example, tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Jr), or rhodium (Rh). The first contact filling layer 142 may include at least one of, for example, aluminum (Al), tungsten (W), cobalt (Co), ruthenium (Ru), or molybdenum (Mo).

The source/drain contact 150 may be disposed above the source/drain region 130. For example, the source/drain contact 150 may be disposed between the first gate electrode 110 and the second gate electrode 120. The source/drain contact 150 may be disposed in a second contact trench CT2 formed between the first gate electrode 110 and the second gate electrode 120.

The source/drain contact 150 may comprise a first portion 150_1 disposed above the source/drain region 130 and a second portion 150_2 protruding from the first portion 150_1 in the vertical direction Z.

For example, the top surface of the first portion 150_1 of the source/drain contact 150 may be formed to be lower than the top surface of the first gate electrode 110. However, inventive concepts are not limited thereto. The top surface of the second portion 150_2 of the source/drain contact 150, which is the topmost surface of the source/drain contact 150, may be formed on the same plane as the top surface of the gate contact 140.

The source/drain contact 150 may comprise a second contact barrier layer 151 and a second contact filling layer 152. The second contact barrier layer 151 may be disposed along the sidewall and the bottom surface of the second contact trench CT2. The top surface of the second contact barrier layer 151 may be formed at a same level as, e.g. on the same plane as, the top surface of the first portion 150_1 of the source/drain contact 150. The second contact barrier layer 151 is not disposed on the sidewall of the second portion 150_2 of the source/drain contact 150. The second contact filling layer 152 may be disposed on the second contact barrier layer 151 in the second contact trench CT2.

The first portion 150_1 of the source/drain contact 150 may comprise the second contact barrier layer 151 and the second contact filling layer 152 disposed on the second contact barrier layer 151. The second portion 150_2 of the source/drain contact 150 may comprise the second contact filling layer 152.

The second contact barrier layer 151 may include at least one of, for example, tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), or rhodium (Rh). The second contact filling layer 152 may include at least one of, for example, aluminum (Al), tungsten (W), cobalt (Co), ruthenium (Ru), or molybdenum (Mo).

The silicide layer 135 may be disposed between the source/drain region 130 and the source/drain contact 150. It is illustrated that the silicide layer 135 is formed along the profile of the interface between the source/drain region 130 and the source/drain contact 150, but inventive concepts are not limited thereto. The silicide layer 135 may include, for example, a metal silicide material.

The filling insulating layer 160 may be disposed on the source/drain contact 150 in the second contact trench CT2. The filling insulating layer 160 may completely fill the second contact trench CT2.

The filling insulating layer 160 may be disposed on the top surface of the first portion 150_1 of the source/drain contact 150. The filling insulating layer 160 is not in contact with the sidewall of the first portion 150_1 of the source/drain contact 150. The filling insulating layer 160 may surround the sidewall of the second portion 150_2 of the source/drain contact 150.

A top surface 160a of the filling insulating layer 160 may be in contact with the etch stop layer 175. The filling insulating layer 160 is not in contact with the gate contact 140. The filling insulating layer 160 may be in contact with the respective sidewalls of the first capping pattern 113 and the second capping pattern 123. The filling insulating layer 160 may be in contact with the respective sidewalls of the first gate spacer 112 and the second gate spacer 122, but inventive concepts are not limited thereto.

The top surface 160a of the filling insulating layer 160 may be formed at a same level as, e.g. on the same plane as, each of the top surface 113a of the first capping pattern 113, the top surface of the second capping pattern 123, the top surface of the gate contact 140, and the top surface of the second portion 150_2 of the source/drain contact 150.

The filling insulating layer 160 may include, for example, a compound containing a carbon (C) atom. The filling insulating layer 160 may include, for example, any one of silicon oxycarbide (SiOC), silicon carbide (SiC), silicon carbonitride (SiCN), and silicon oxycarbonitride (SiOCN). However, inventive concepts are not limited thereto.

The first interlayer insulating layer 170 may be disposed above the field insulating layer 105. The first interlayer insulating layer 170 may surround the sidewall of the first gate spacer 112, the sidewall of the second gate spacer 122, the sidewall of the first capping pattern 113, the sidewall of the second capping pattern 123, the sidewall of the source/drain region 130, and the sidewall of the filling insulating layer 160. The sidewall of the second portion 150_2 of the source/drain contact 150 may be surrounded by the first capping pattern 113, the second capping pattern 123, and the filling insulating layer 160.

The top surface of the first interlayer insulating layer 170 may be in contact with, e.g. in direct contact with, the etch stop layer 175. The first interlayer insulating layer 170 may be in contact with e.g. in direct contact with, the sidewall of the first portion 150_1 of the source/drain contact 150. The first interlayer insulating layer 170 is not in contact with the second portion 150_2 of the source/drain contact 150. The first interlayer insulating layer 170 is not in contact with or in direct contact with, e.g. may isolated from, the gate contact 140.

A topmost surface 170a of the first interlayer insulating layer 170 may be formed at a same level as, e.g. on the same plane as, each of the top surface 113a of the first capping pattern 113, the top surface of the second capping pattern 123, the top surface of the gate contact 140, the top surface of the second portion 150_2 of the source/drain contact 150, and the top surface 160a of the filling insulating layer 160.

The first interlayer insulating layer 170 may include a material different from the filling insulating layer 160. The first interlayer insulating layer 170 may include, for example, at least one of silicon oxide, silicon nitride, silicon oxynitride, or a low dielectric constant material. The low dielectric constant material may include, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazene (TOSZ), fluoride silicate glass (FSG), polyimide nanofoams such as polypropylene oxide, carbon doped silicon oxide (CDO), organo silicate glass (OSG), SILK, amorphous fluorinated carbon, silica aerogels, silica xerogels, mesoporous silica, or a combination thereof, but inventive concepts are not limited thereto.

The etch stop layer 175 may be disposed on the first interlayer insulating layer 170, the filling insulating layer 160, the first capping pattern 113 and the second capping pattern 123. Although it is depicted in FIGS. 2 to 6 that the etch stop layer 175 is formed as a single layer, inventive concepts are not limited thereto. In some other example embodiments, the etch stop layer 175 may be formed as a multilayer. The etch stop layer 175 may include, for example, at least one of silicon oxide, silicon nitride, silicon oxynitride, or a low dielectric constant material.

The second interlayer insulating layer 180 may be disposed on the etch stop layer 175. The second interlayer insulating layer 180 may include, for example, at least one of silicon oxide, silicon nitride, silicon oxynitride, or a low dielectric constant material. The low dielectric constant material may include, for example, fluorinated tetraethylorthosilicate (FTEOS), hydrogen silsesquioxane (HS Q), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazene (TOSZ), fluoride silicate glass (FSG), polyimide nanofoams such as polypropylene oxide, carbon doped silicon oxide (CDO), organo silicate glass (OSG), SILK, amorphous fluorinated carbon, silica aerogels, silica xerogels, mesoporous silica, or a combination thereof, but inventive concepts are not limited thereto.

The first via 191 may penetrate the second interlayer insulating layer 180 and the etch stop layer 175 in the vertical direction Z to be connected to the gate contact 140. The first via 191 may comprise a first via barrier layer 191_1 and a first via filling layer 191_2 disposed on the first via barrier layer 191_1.

The second via 192 may penetrate the second interlayer insulating layer 180 and the etch stop layer 175 in the vertical direction Z to be connected to the second portion 150_2 of the source/drain contact 150. The second via 192 may comprise a second via barrier layer 192_1 and a second via filling layer 192_2 disposed on the second via barrier layer 192_1.

Each of the first via barrier layer 191_1 and the second via barrier layer 192_1 may include at least one of, for example, tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Jr), or rhodium (Rh). Each of the first via filling layer 191_2 and the second via filling layer 192_2 may include, for example, at least one of aluminum (Al), copper (Cu), tungsten (W), cobalt (Co), ruthenium (Ru), or molybdenum (Mo).

Hereinafter, a semiconductor device according to some other example embodiments of inventive concepts will be described with reference to FIGS. 7 and 8. Differences from the semiconductor device shown in FIGS. 1 to 6 will be mainly described. Example embodiments described with reference to FIGS. 1 to 6 may not be mutually exclusive from example embodiments described with reference to FIGS. 7 and 8. For example, unless otherwise clear from context, some example embodiments may include features illustrated and described with reference to FIGS. 1 to 6 and other features illustrated and described with reference to FIGS. 7 and 8.

Figure 7:
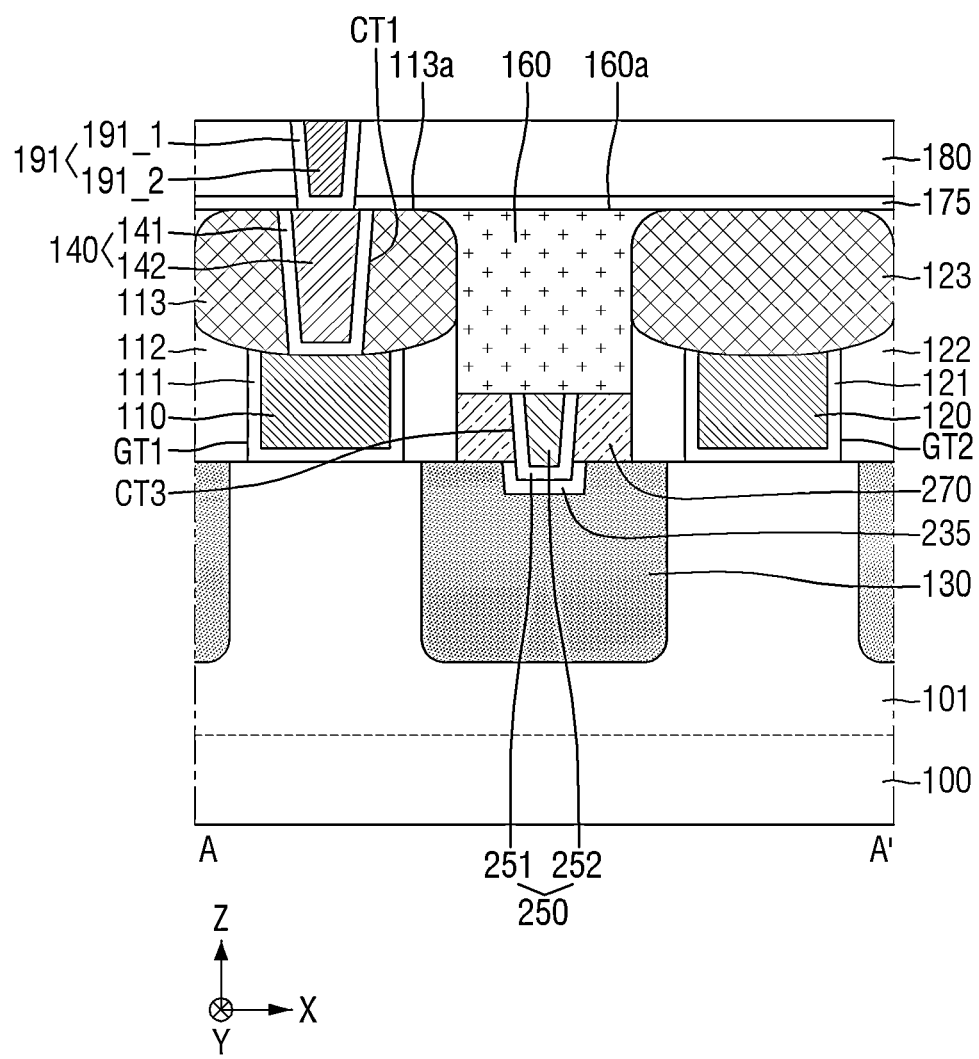
FIGS. 7 and 8 are cross-sectional views showing a semiconductor device according to some example embodiments of inventive concepts.
Figure 8:
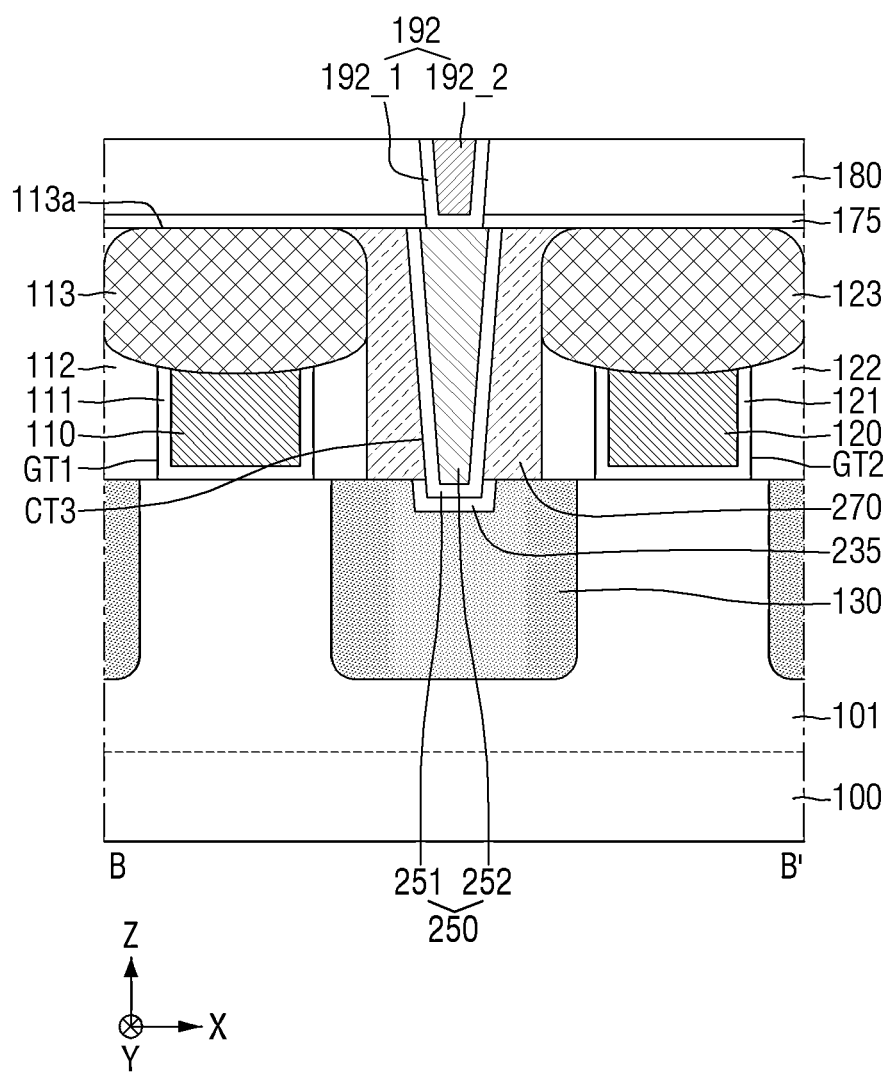

FIGS. 7 and 8 are cross-sectional views showing a semiconductor device according to some other example embodiments of inventive concepts.

Referring to FIGS. 7 and 8, the semiconductor device according to some other example embodiments of inventive concepts may comprise a first interlayer insulating layer 270 arranged between a source/drain contact 250 and the first gate electrode 110 and between the source/drain contact 250 and the second gate electrode 120. For example, the first interlayer insulating layer 270 may be disposed on both sides of the source/drain contact 250 in the first horizontal direction X.

A third contact trench CT3 may penetrate the first interlayer insulating layer 270 in the vertical direction Z between the first gate electrode 110 and the second gate electrode 120. The source/drain contact 250 may be disposed in the third contact trench CT3.

The source/drain contact 250 may comprise a first contact barrier layer 251 and a first contact filling layer 252 disposed on the first contact barrier layer 251. A silicide layer 235 may be disposed between the source/drain contact 250 and the source/drain region 130.

Hereinafter, a semiconductor device according to still other embodiments of inventive concepts will be described with reference to FIGS. 9 and 10. Differences from the semiconductor device shown in FIGS. 1 to 6 will be mainly described. Example embodiments described with reference to FIGS. 1 to 6 may not be mutually exclusive from example embodiments described with reference to FIGS. 9 and 10. For example, unless otherwise clear from context, some example embodiments may include features illustrated and described with reference to FIGS. 1 to 6 and other features illustrated and described with reference to FIGS. 9 and 10.

Figure 9:
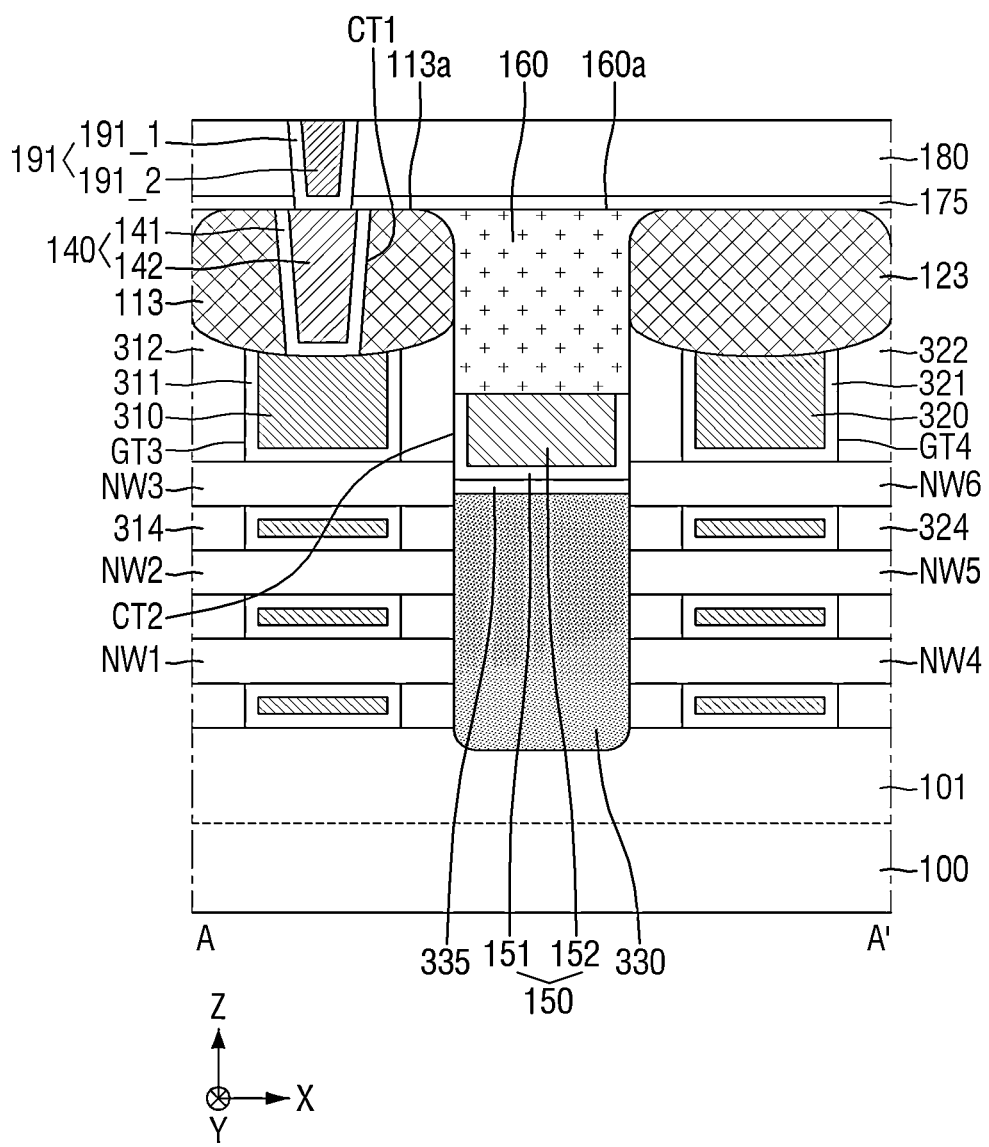
FIGS. 9 and 10 are cross-sectional views illustrating a semiconductor device according to example embodiments of inventive concepts.
Figure 10:
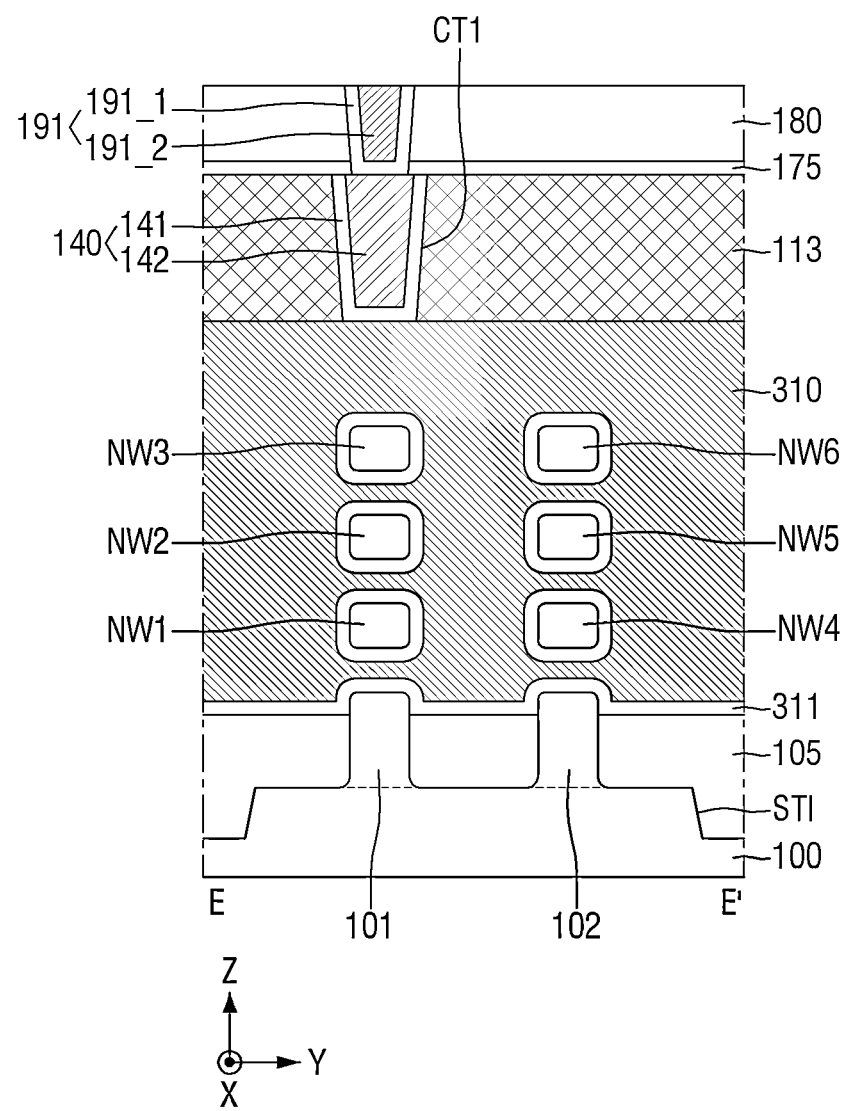

FIGS. 9 and 10 are cross-sectional views illustrating a semiconductor device according to still other example embodiments of inventive concepts.

Referring to FIGS. 9 and 10, the semiconductor device according to still other embodiments of inventive concepts may comprise a multi-bridge channel field effect transistor (MBCFET™).

Specifically, the semiconductor device according to still other example embodiments of inventive concepts may comprise a plurality of nanowires sequentially stacked in the vertical direction Z on the fin-type patterns 101 and 102 of the active region I while being spaced apart from each other.

For example, first to third nanowires NW1, NW2, and NW3 may be sequentially stacked on the first fin-type pattern 101 in the vertical direction Z while being spaced apart from each other. Fourth to sixth nanowires NW4, NW5, and NW6 may be sequentially stacked on the second fin-type pattern 102 in the vertical direction Z while being spaced apart from each other. Each of the first to sixth nanowires NW1, NW2, NW3, NW4, NW5, and NW6 may extend in the first horizontal direction X. The first to third nanowires NW1, NW2, and NW3 may be spaced apart from the fourth to sixth nanowires NW4, NW5, and NW6 in the first horizontal direction X. Although six nanowires NW1 to NW6 are illustrated, example embodiments are not limited thereto, and the number of nanowires may be more than, or less than, those illustrated.

FIGS. 9 and 10 illustrate that three nanowires are stacked in the vertical direction Z, but this is merely for simplicity of description, and inventive concepts are not limited thereto.

A first gate electrode 310 may surround each of the first to third nanowires NW1, NW2, and NW3. A second gate electrode 320 may surround each of the fourth to sixth nanowires NW4, NW5, and NW6.

A source/drain region 330 may be disposed between the first to third nanowires NW1, NW2, and NW3 and the fourth to sixth nanowires NW4, NW5, and NW6. A silicide layer 335 may be disposed between the source/drain contact 150 and the source/drain region 330.

First internal spacers 314 may be disposed between the first gate electrode 310 and the source/drain region 330. The first internal spacers 314 may be arranged between the first fin-type pattern 101 and the first nanowire NW1, between the first nanowire NW1 and the second nanowire NW2, and between the second nanowire NW2 and the third nanowire NW3.

Second internal spacers 324 may be disposed between the second gate electrode 320 and the source/drain region 330. The second internal spacers 324 may be arranged between the second fin-type pattern 102 and the fourth nanowire NW4, between the fourth nanowire NW4 and the fifth nanowire NW5, and between the fifth nanowire NW5 and the sixth nanowire NW6.

A first gate insulating layer 311 may be disposed along a sidewall and a bottom surface of a first gate trench GT3. Further, the first gate insulating layers 311 may be disposed between the first fin-type pattern 101 and the first gate electrode 310, between the first gate electrode 310 and each of the first to third nanowires NW1, NW2, and NW3, and between the first internal spacer 314 and the first gate electrode 310, respectively.

A second gate insulating layer 321 may be disposed along a sidewall and a bottom surface of a second gate trench GT4. Alternatively or additionally, the second gate insulating layers 321 may be disposed between the second fin-type pattern 102 and the second gate electrode 320, between the second gate electrode 320 and each of the fourth to sixth nanowires NW4, NW5, and NW6, and between the second internal spacer 324 and the second gate electrode 320, respectively.

First gate spacers 312 may be disposed along both sidewalls of the first gate electrode 310. Second gate spacers 322 may be disposed along both sidewalls of the second gate electrode 320.

Hereinafter, a semiconductor device according to still other example embodiments of inventive concepts will be described with reference to FIG. 11. Differences from the semiconductor device shown in FIGS. 9 and 10 will be mainly described. Example embodiments described with reference to FIGS. 9 and 10 may not be mutually exclusive from example embodiments described with reference to FIG. 11. For example, unless otherwise clear from context, some example embodiments may include features illustrated and described with reference to FIGS. 9 and 10 and other features illustrated and described with reference to FIG. 11.

Figure 11:
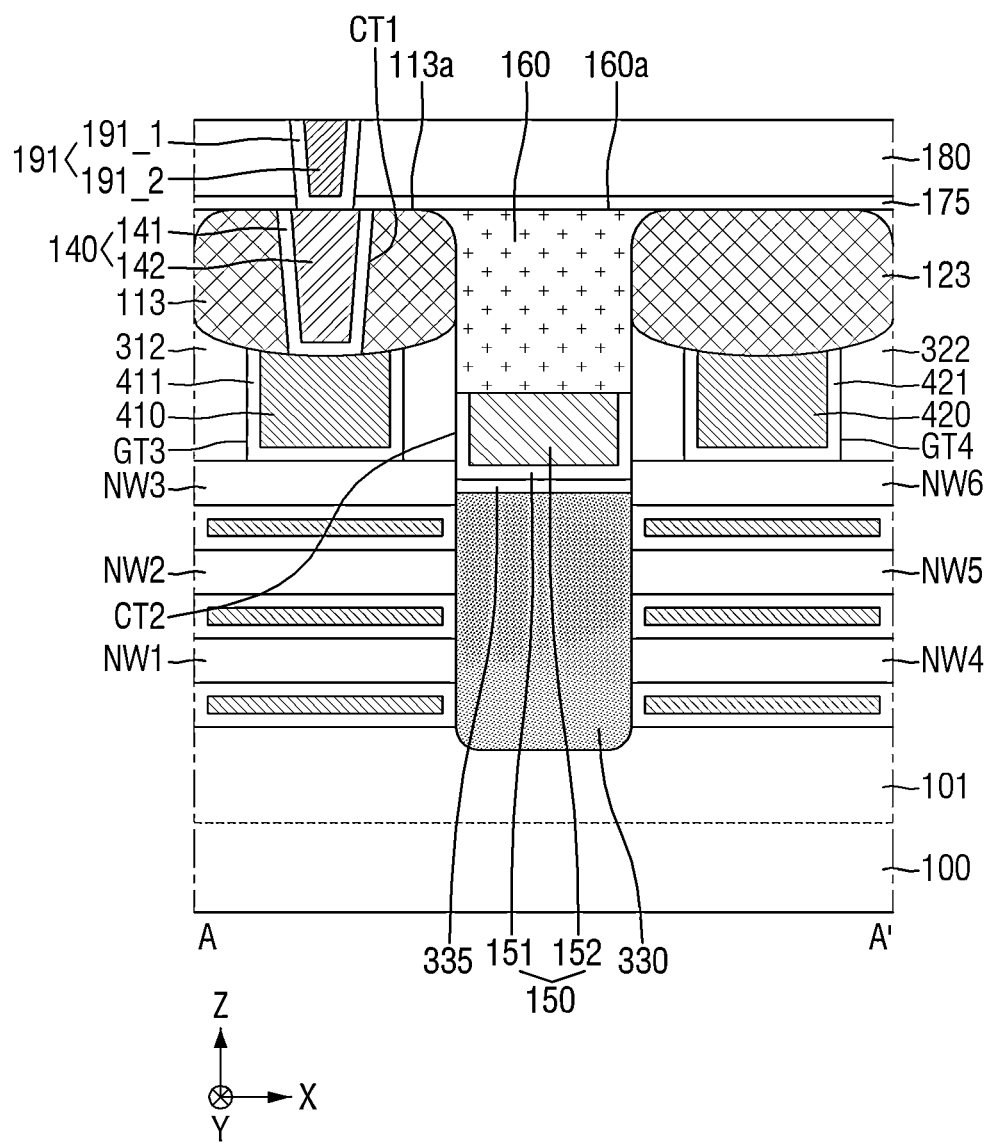
FIG. 11 is a cross-sectional view illustrating a semiconductor device according to example embodiments of inventive concepts.

FIG. 11 is a cross-sectional view illustrating a semiconductor device according to still other example embodiments of inventive concepts.

Referring to FIG. 11, in the semiconductor device according to still other embodiments of inventive concepts, the internal spacers 314 and 324 (in FIG. 9) are not disposed.

The width of each of first gate electrodes 410 in the first horizontal direction X, which are disposed between the first, second, and third nanowires NW1, NW2, and NW3, may be greater than the width of the gate electrode 410 in the first horizontal direction X, which is disposed in the first gate trench GT3. Alternatively or additionally, the width of each of second gate electrodes 420 in the first horizontal direction X, which are disposed between the fourth, fifth, and sixth nanowires NW4, NW5, and NW6, may be greater than the width of the second gate electrode 420 in the first horizontal direction X, which is disposed in the second gate trench GT4.

First gate insulating layers 411 may be in contact with the source/drain region 330, between the first, second, and third nanowires NW1, NW2, and NW3. Second gate insulating layers 421 may be in contact with the source/drain region 330, between the fourth, fifth, and sixth nanowires NW4, NW5, and NW6.

Hereinafter, a method for fabricating a semiconductor device according to some embodiments of inventive concepts will be described with reference to FIGS. 12 to 26.

FIGS. 12 to 26 are diagrams illustrating intermediate steps of a method for fabricating a semiconductor device according to some example embodiments of inventive concepts.

Figure 12:
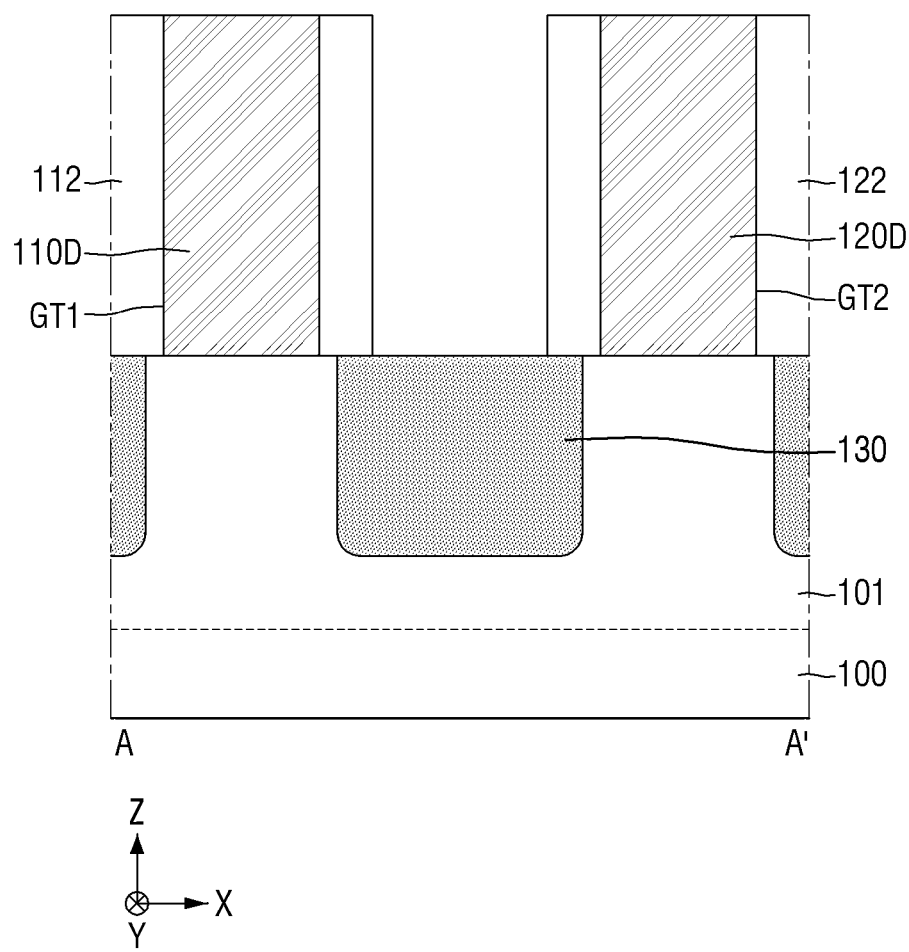
FIGS. 12 to 26 are diagrams illustrating intermediate steps of a method for fabricating a semiconductor device according to some example embodiments of inventive concepts.
Figure 13:
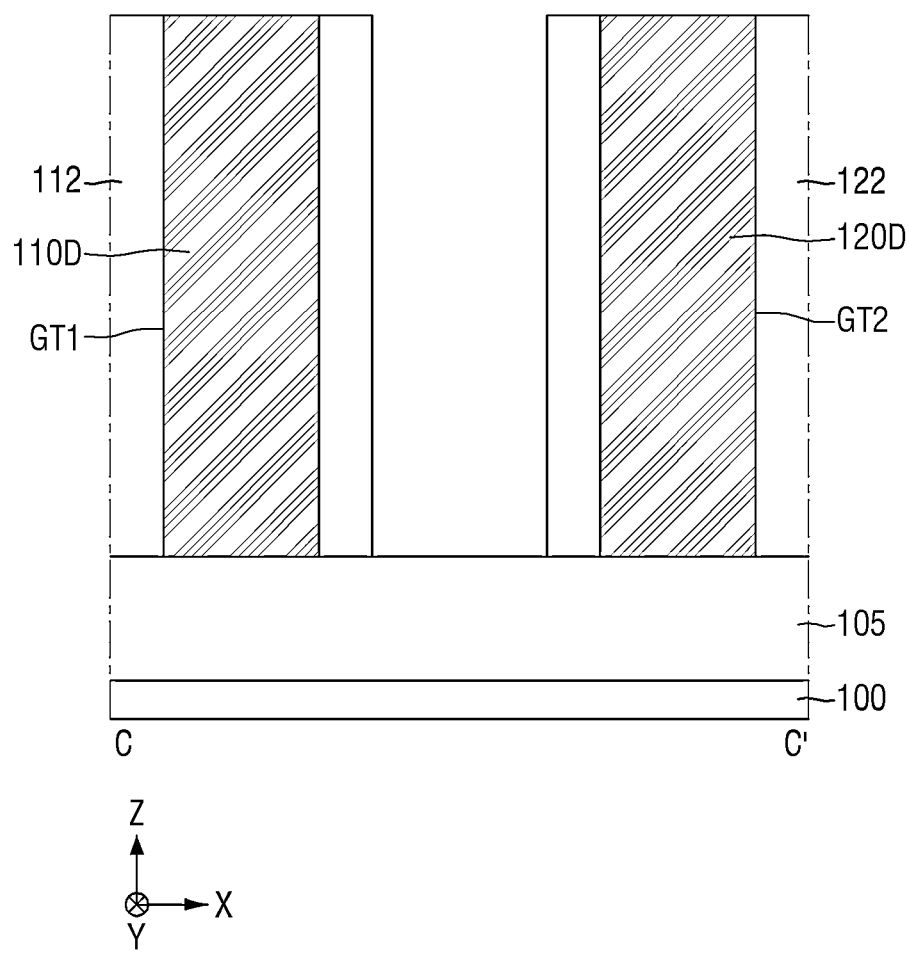

Referring to FIGS. 12 and 13, the active region I (in FIG. 1) may be defined by forming the element isolation region II (in FIG. 1) on the substrate 100. Subsequently, the first fin-type pattern 101 may be formed on the substrate 100, and may extend in the first horizontal direction X.

Thereafter, a first dummy gate 110D and a second dummy gate 120D may be formed on the first fin-type pattern 101 and the field insulating layer 105, and may extend in the second horizontal direction Y. The second dummy gate 120D may be spaced apart from the first dummy gate 110D in the first horizontal direction X. The first gate spacers 112 may be formed along both sidewalls of the first dummy gate 110D, and the second gate spacers 122 may be formed along both sidewalls of the second dummy gate 120D. The first and second dummy gates 110D and 120D may be formed of or include a material, such as an oxide and/or a metal; however, example embodiments are not limited thereto.

Then, the source/drain region 130 may be formed on at least one side of the first dummy gate 110D and at least one side of the second dummy gate 120D. The source/drain regions 130 may be formed within the first fin-type pattern 101, e.g. may be formed with an implantation process such as an ion implantation process.

Figure 14:
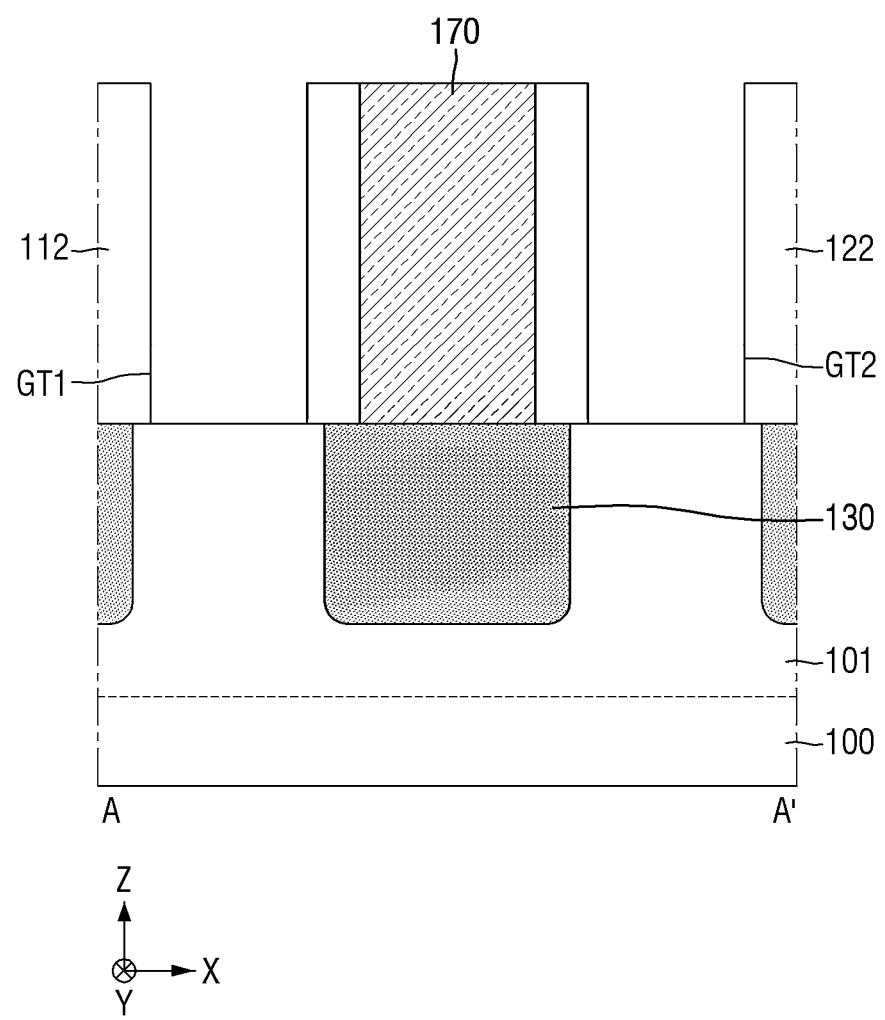
Figure 15:
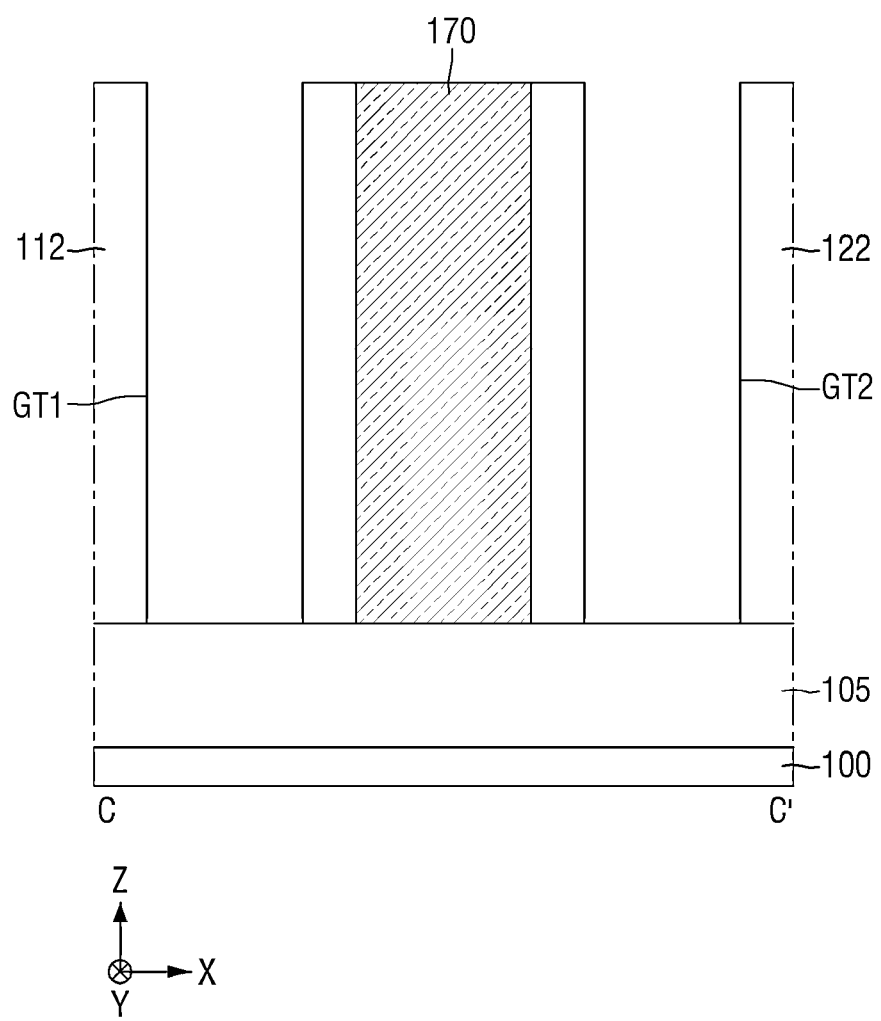

Referring to FIGS. 14 and 15, the first interlayer insulating layer 170 may be formed to cover the first dummy gate 110D, the second dummy gate 120D, the source/drain region 130 and the field insulating layer 105. Subsequently, a planarization process (e.g., a chemical mechanical planarization (CMP) process and/or an etch-back process) may be performed to expose the top surfaces of the first dummy gate 110D and the second dummy gate 120D.

Thereafter, the first gate trench GT1 may be formed between the first gate spacers 112 by removing the first dummy gate 110D, e.g. removing the first dummy gate 110D with a wet-etching process and/or with a dry-etching process. Further, e.g. simultaneously, the second gate trench GT2 may be formed between the second gate spacers 122 by removing the second dummy gate 120D, e.g. removing the first dummy gate 110D with a wet-etching process and/or with a dry-etching process.

Figure 16:
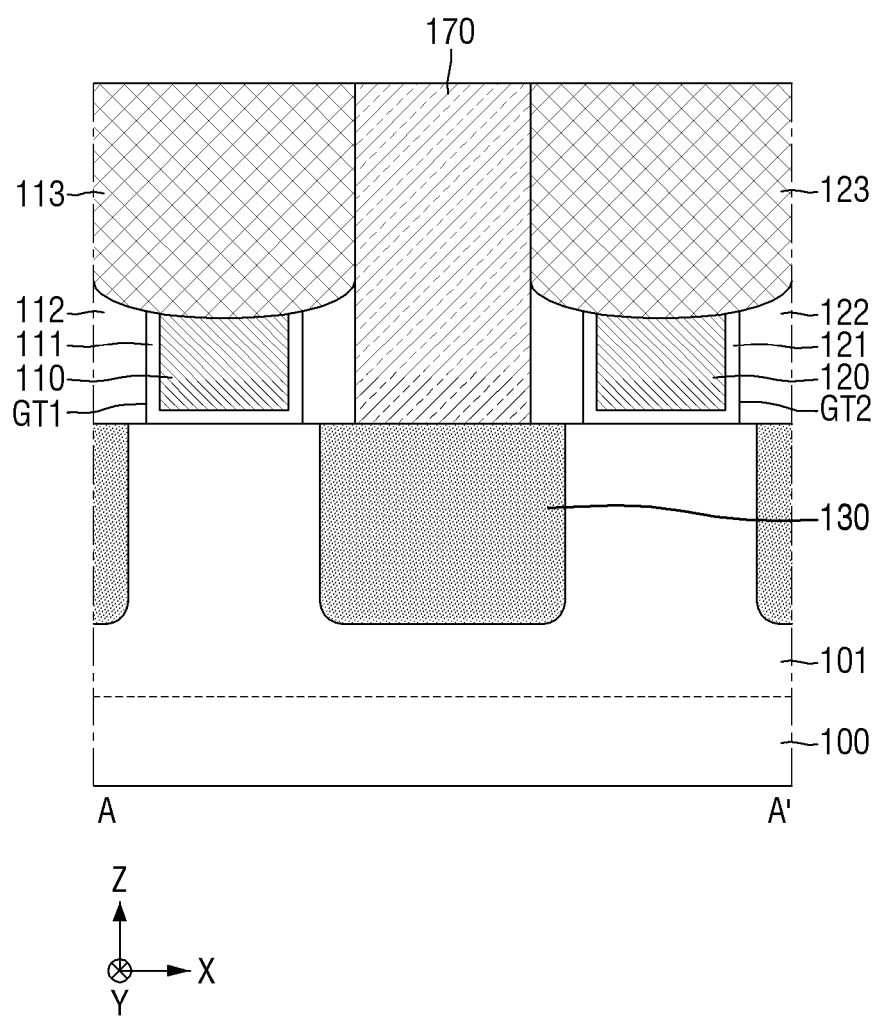
Figure 17:
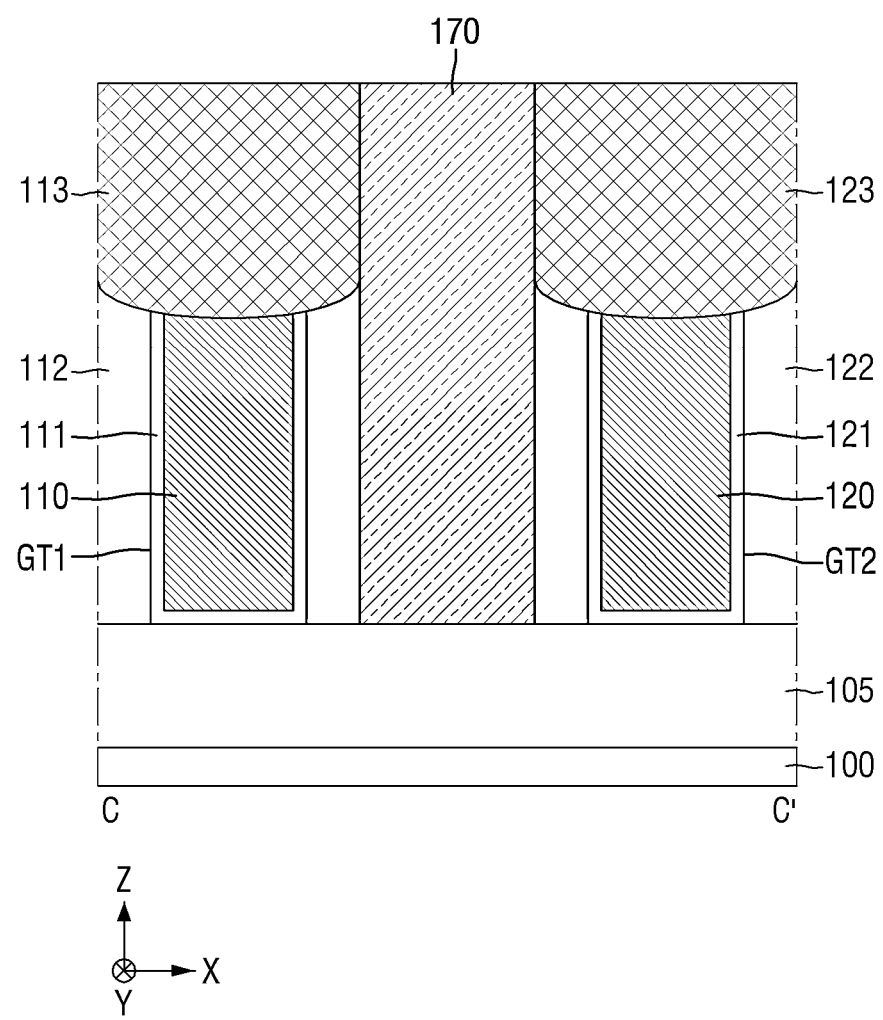

Referring now to FIGS. 16 and 17, the first gate insulating layer 111 may be formed along the sidewall and the bottom surface of, e.g. may be formed conformally along, the first gate trench GT1, and the second gate insulating layer 121 may be formed along the sidewall and the bottom surface of, e.g. may be formed conformally along, the second gate trench GT2. The first gate insulating layer 111 and the second gate insulating layer 121 may be formed with an oxidation process such as a thermal oxidation process, and/or may be formed with a deposition process such as a chemical vapor deposition (CVD) process.

Then, the first gate electrode 110 may be formed on the first gate insulating layer 111 to fill the first gate trench GT1. Further, the second gate electrode 120 may be formed on the second gate insulating layer 121 to fill the second gate trench GT2.

Subsequently, parts of the respective first gate electrode 110, first gate insulating layer 111, and first gate spacers 112 may be removed, e.g. may be etched with an isotropic and/or anisotropic etch. Further or simultaneously, parts of the respective second gate electrode 120, second gate insulating layer 121, and second gate spacers 122 may be removed, e.g. may be etched with an isotropic and/or anisotropic etch.

Thereafter, the first capping pattern 113 may be formed on the first gate electrode 110, the first gate insulating layer 111, and the first gate spacers 112. In addition, e.g. simultaneously, the second capping pattern 123 may be formed on the second gate electrode 120, the second gate insulating layer 121, and the second gate spacers 122. A profile, e.g. a lower profile, of the first capping pattern 113 and the second capping pattern 123 may be concave, e.g. shaped as a bowl with respect to the surface of the substrate 100.

Figure 18:
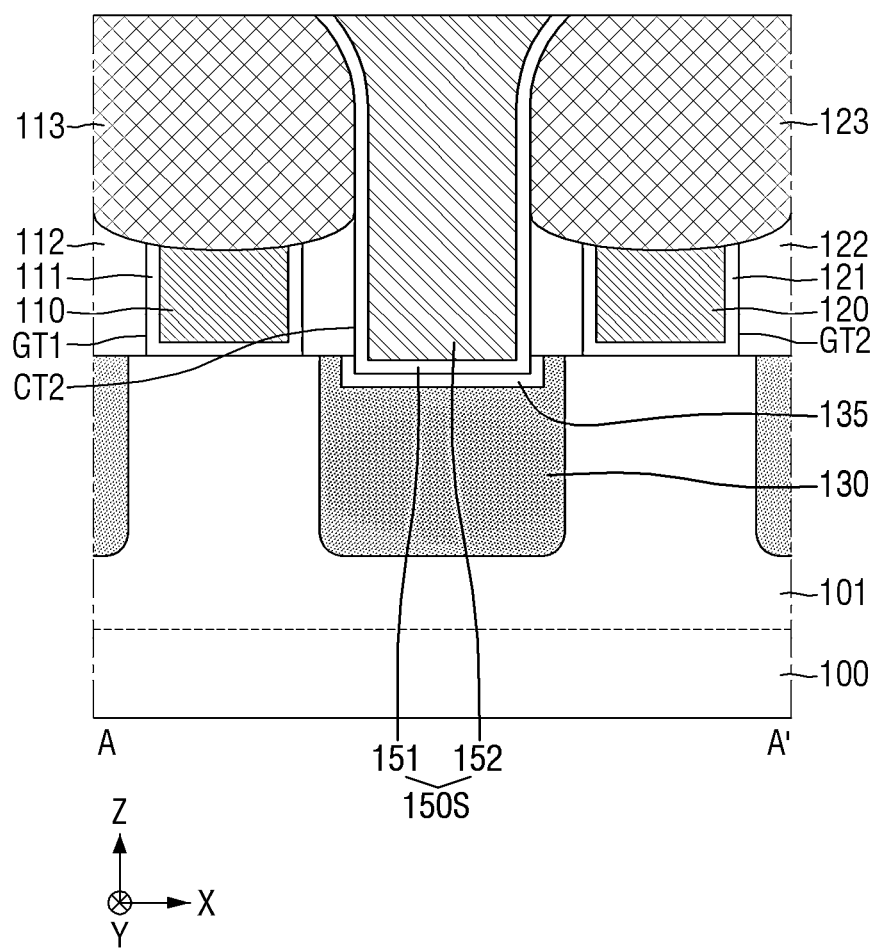

Referring to FIG. 18, the second contact trench CT2 may be formed between the first gate electrode 110 and the second gate electrode 120 to penetrate the first interlayer insulating layer 170 in the vertical direction Z. Through the second contact trench CT2, at least a part of the first capping pattern 113 and at least a part of the second capping pattern 123 may be exposed. In addition, through the second contact trench CT2, at least a part of the first gate spacer 112 and at least a part of the second gate spacer 122 may be exposed.

The source/drain region 130 may be exposed through the second contact trench CT2. For example, at least a part of the second contact trench CT2 may extend into the source/drain region 130, but inventive concepts are not limited thereto.

Subsequently, the silicide layer 135 may be formed in the source/drain region 130 through the second contact trench CT2. Thereafter, a contact structure 150S may be formed to fill the second contact trench CT2.

Figure 19:
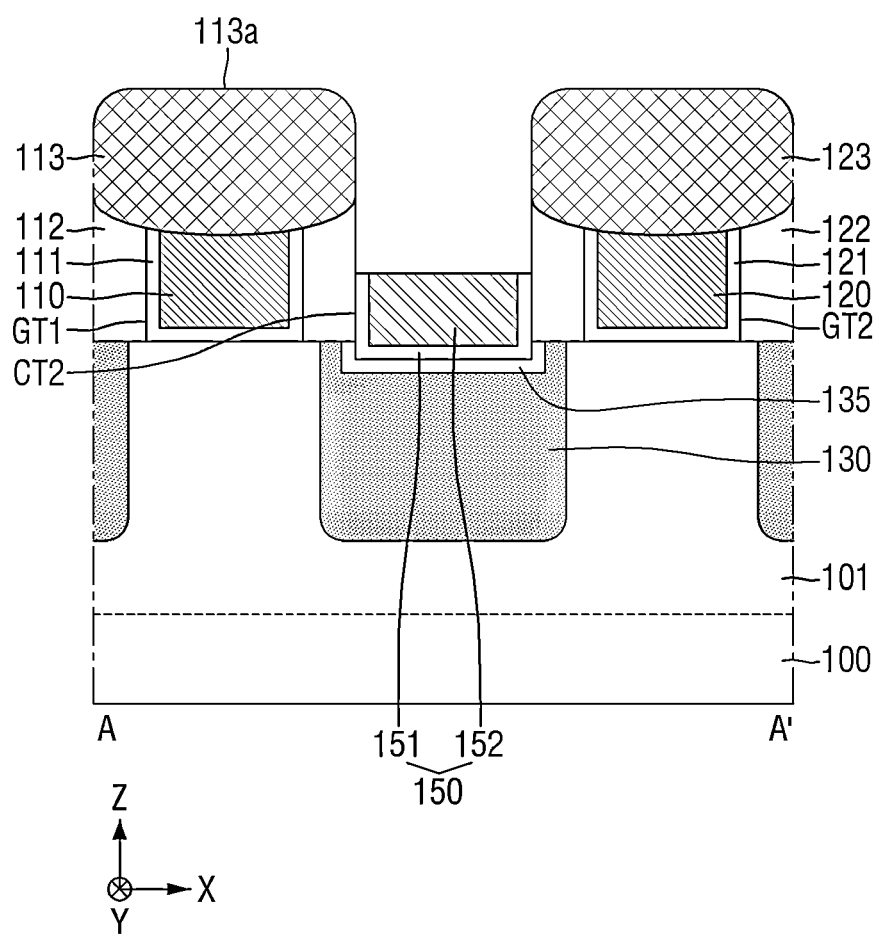
Figure 20:
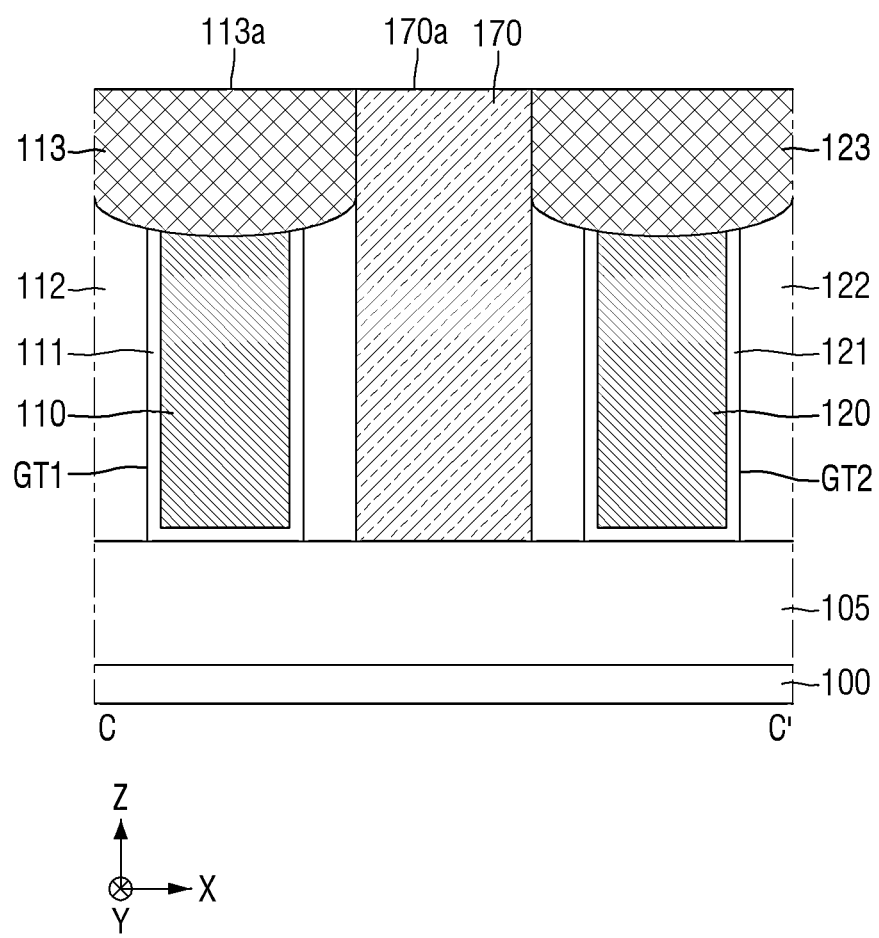

Referring to FIGS. 19 and 20, the source/drain contact 150 may be formed by partially etching, e.g. partially dry etching, the contact structure 150S. Specifically, a mask pattern may be formed on a portion corresponding to the second portion 150_2 (in FIG. 5) of the source/drain contact 150, and then the contact structure 150S may be partially etched, thereby forming the source/drain contact 150. The source/drain contact 150 may comprise the first portion 150_1 (in FIG. 5) formed on the source/drain region 130 and the second portion 150_2 (in FIG. 5) extending from the first portion 150_1 (in FIG. 5) in the vertical direction Z.

While the contact structure 150S is partially etched, an upper part of the first capping pattern 113 and an upper part of the second capping pattern 123 may be etched, respectively; for example, the partial etch of the contact structure 150S may simultaneously etch an upper part of the first capping pattern 113 and an upper part of the second capping pattern 123. The top surface 113a of the first capping pattern 113 disposed on the first fin-type pattern 101 may be formed to be at a same level as, e.g. on the same plane as, the top surface 113a of the first capping pattern 113 disposed on the field insulating layer 105.

Figure 21:
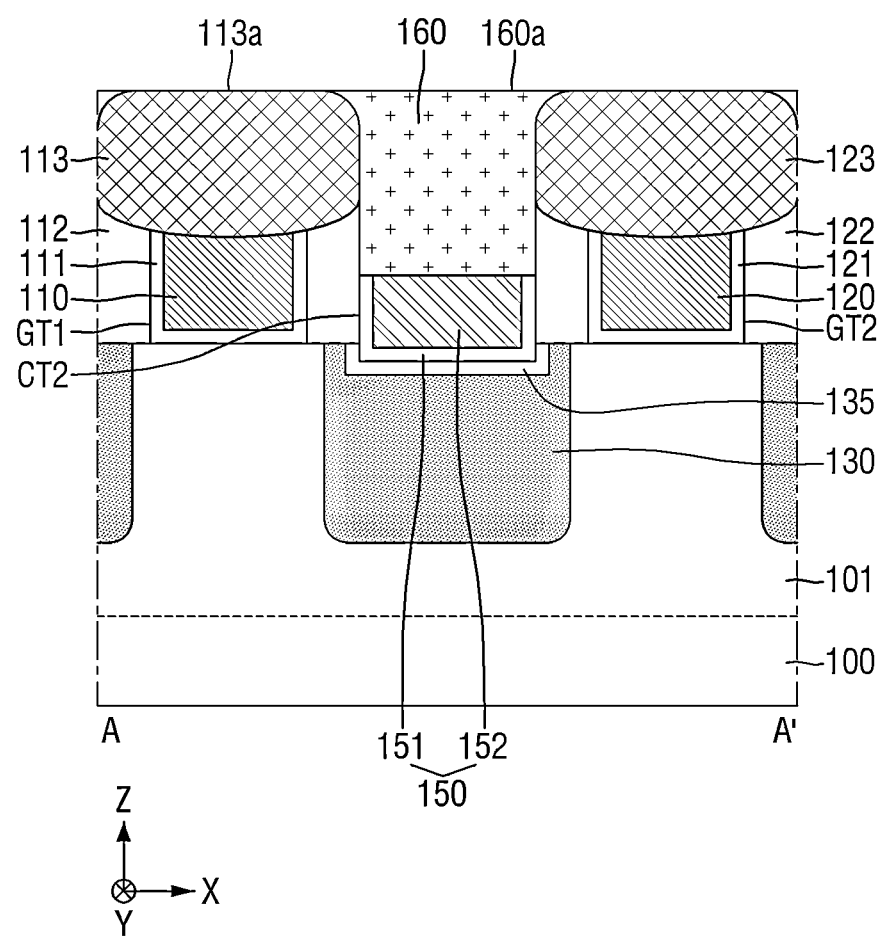

Referring now to FIG. 21, the filling insulating layer 160 may be formed in the second contact trench CT2, and on the first capping pattern 113, the second capping pattern 123, and the first interlayer insulating layer 170. The filling insulating layer 160 may be formed with a CVD process; however, example embodiments are not limited thereto. Subsequently, through a first planarization process (e.g., a CMP process and/or an etch-back process), the filling insulating layer 160 is etched to expose the top surface 113a of the first capping pattern 113 and the top surface of the second capping pattern 123. Accordingly, the filling insulating layer 160 does not exist on the top surface 113a of the first capping pattern 113 and on the top surface of the second capping pattern 123.

The filling insulating layer 160 may completely fill the inside of the second contact trench CT2. The top surface 160a of the filling insulating layer 160 may be formed on the same plane as the top surface 113a of the first capping pattern 113, the top surface of the second capping pattern 123, and the top surface 170a of the first interlayer insulating layer 170.

The filling insulating layer 160 may include a material different from the first interlayer insulating layer 170. The filling insulating layer 160 may include, for example, a material and/or a compound containing a carbon (C) atom. The filling insulating layer 160 may include, for example, any one of silicon oxycarbide (SiOC), silicon carbide (SiC), silicon carbonitride (SiCN), and silicon oxycarbonitride (SiOCN). However, inventive concepts are not limited thereto.

Figure 22:
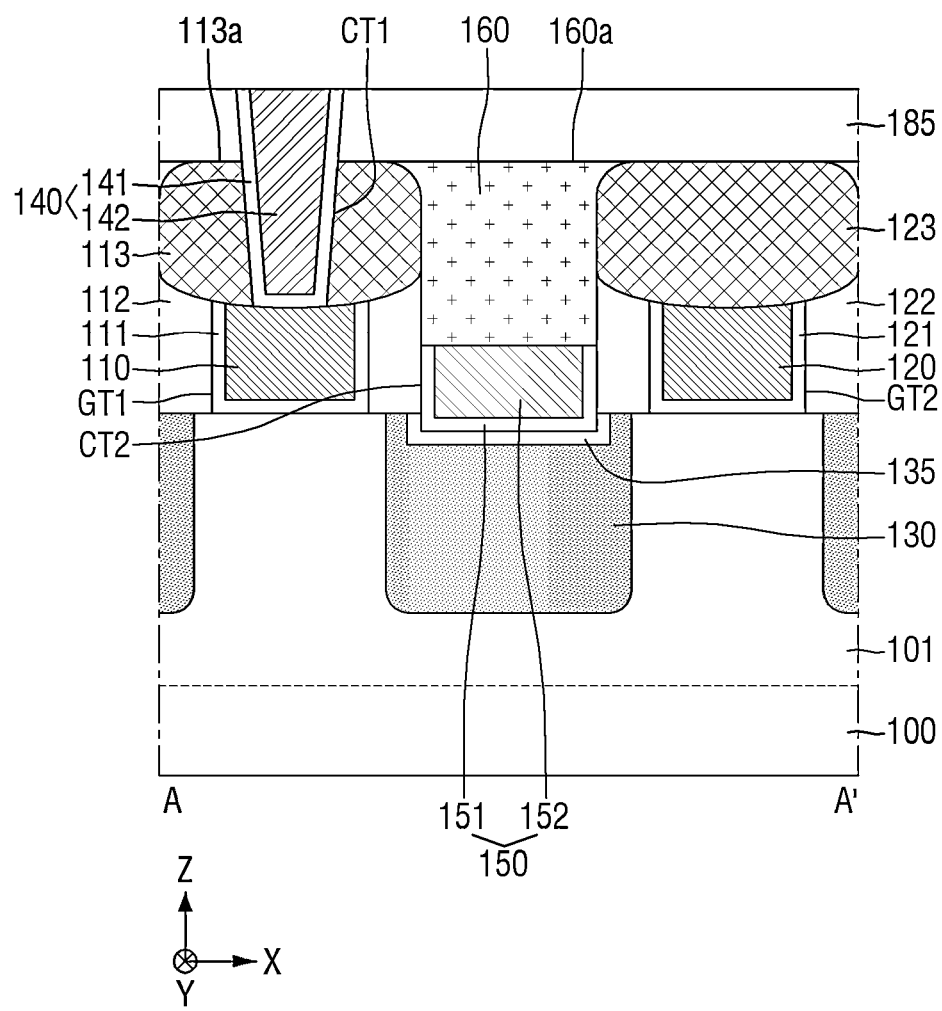
Figure 23:
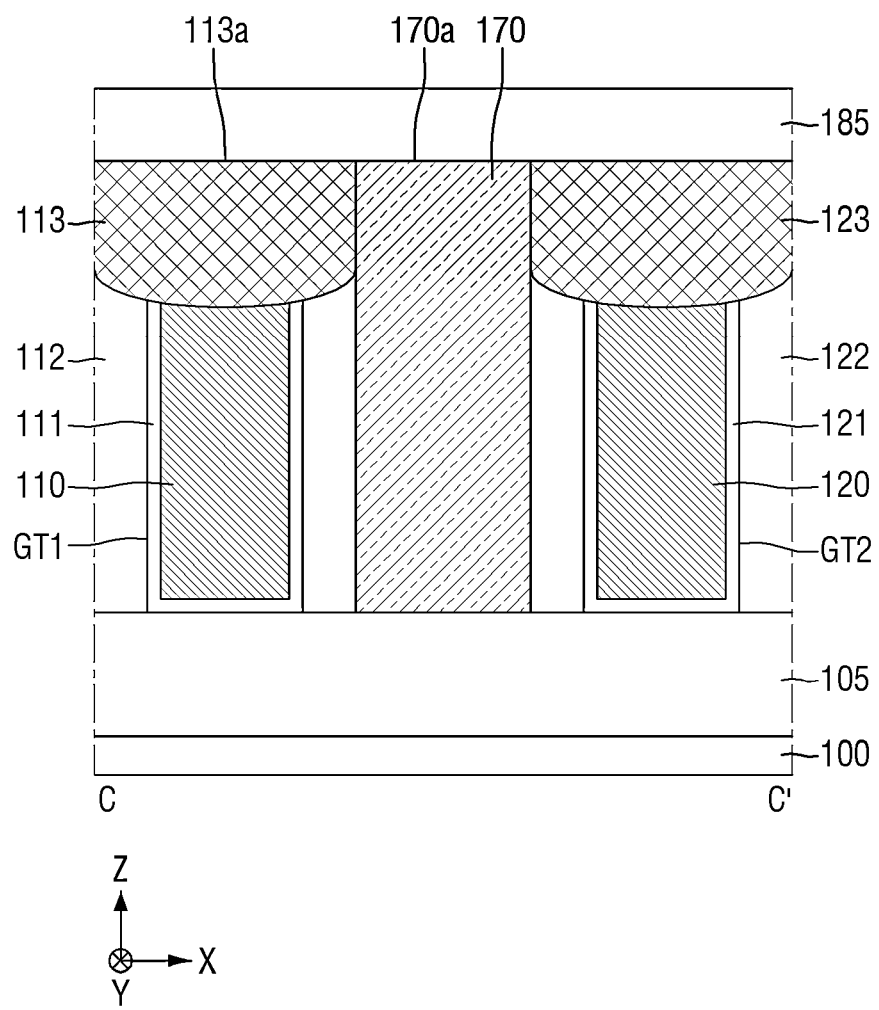

Referring now to FIGS. 22 and 23, a second interlayer insulating layer 185 may be formed on the top surface 113a of the first capping pattern 113, the top surface of the second capping pattern 123, the top surface 170a of the first interlayer insulating layer 170, and the top surface 160a of the filling insulating layer 160.

Subsequently, in the active region I, the first contact trench CT1 may be formed to penetrate the second interlayer insulating layer 185 and the first capping pattern 131 in the vertical direction Z. The first gate electrode 110 may be exposed through the first contact trench CT1. Then, the gate contact 140 may be formed in the first contact trench CT1. The gate contact 140 may be formed of or include the same, or different, material from the source/drain contact 150.

Figure 24:
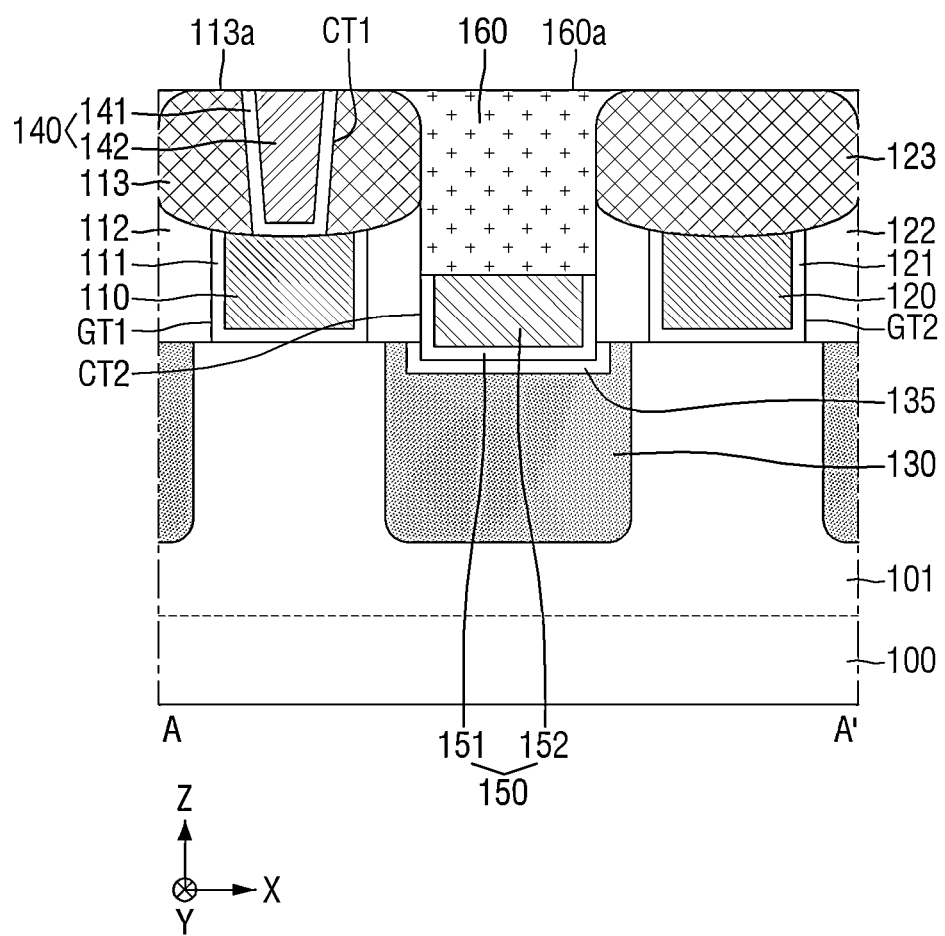
Figure 25:
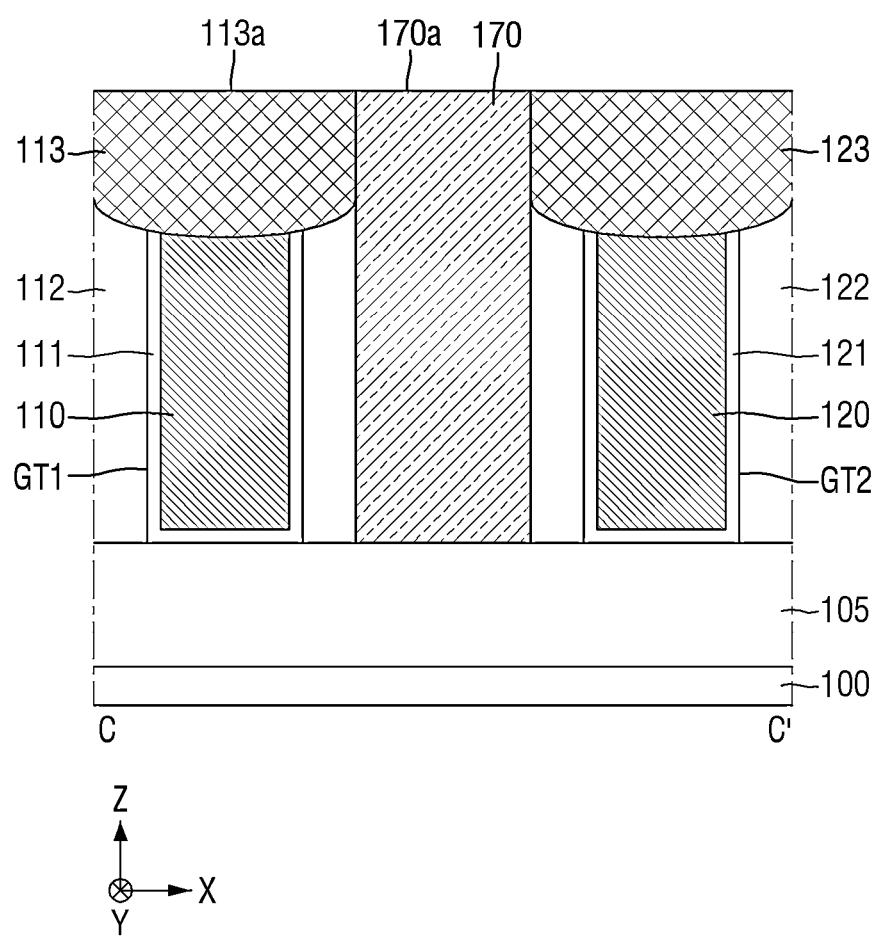

Referring to FIGS. 24 and 25, the second interlayer insulating layer 185 and a part of the gate contact 140 may be removed through a second planarization process (e.g., a CMP process and/or an etch-back process). The top surface 113a of the first capping pattern 113, the top surface of the second capping pattern 123, the top surface 170a of the first interlayer insulating layer 170, and the top surface 160a of the filling insulating layer 160 may be exposed by the second planarization process (e.g., a CMP process and/or an etch-back process). The second planarization process may include the same, or different, process conditions from the first planarization process.

Figure 26:
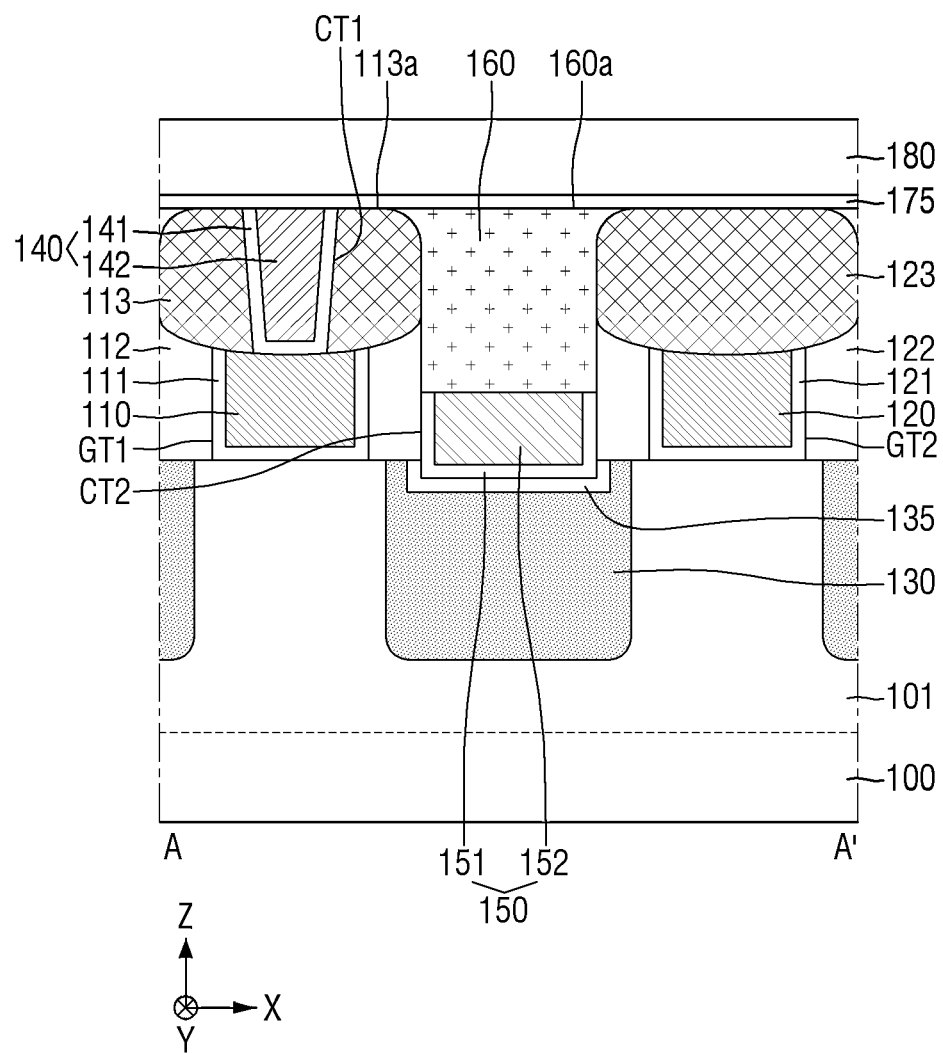

Referring to FIG. 26, the etch stop layer 175 and the third interlayer insulating layer 180 may be sequentially formed on the top surface 113a of the first capping pattern 113, the top surface of the second capping pattern 123, the top surface 170a of the first interlayer insulating layer 170, and the top surface 160a of the filling insulating layer 160.

Referring back to FIGS. 2 and 5, the first via 191 may be formed to penetrate the third interlayer insulating layer 180 and the etch stop layer 175 in the vertical direction Z, on the gate contact 140. In addition, the second via 192 may be formed to penetrate the third interlayer insulating layer 180 and the etch stop layer 175 in the vertical direction Z, on the second portion 150_2 of the source/drain contact 150. Through this fabricating method, the semiconductor device of FIGS. 1 to 6 may be fabricated.

In accordance with the semiconductor device and the method for fabricating the semiconductor device according to some embodiments of inventive concepts, in the step of forming the source/drain contact 150, etching of the capping pattern 113 is reduced or minimized in the active region I, so that the top surface 113a of the capping pattern 113 in the active region I can be formed on substantially at the same level as, e.g. on the same plane as the top surface 113a of the capping pattern 113 in the element isolation region II. With this configuration, the filling insulating layer 160 on the top surfaces of the capping patterns 113 and 123 is removed through the planarization process, and thus there is no need or expectation to etch the filling insulating layer 160 in the step of forming the contact trench CT1 to form the gate contact 140. Therefore, the degree of difficulty in the step of forming the gate contact 140 may be decreased.

Hereinafter, a method for fabricating a semiconductor device according to some other embodiments of inventive concepts will be described with reference to FIGS. 27 to 31. The description will focus on differences from the method of fabricating the semiconductor device illustrated in FIGS. 12 to 26.

FIGS. 27 to 31 are diagrams illustrating intermediate steps of a method for fabricating a semiconductor device according to some example embodiments of inventive concepts.

Figure 27:
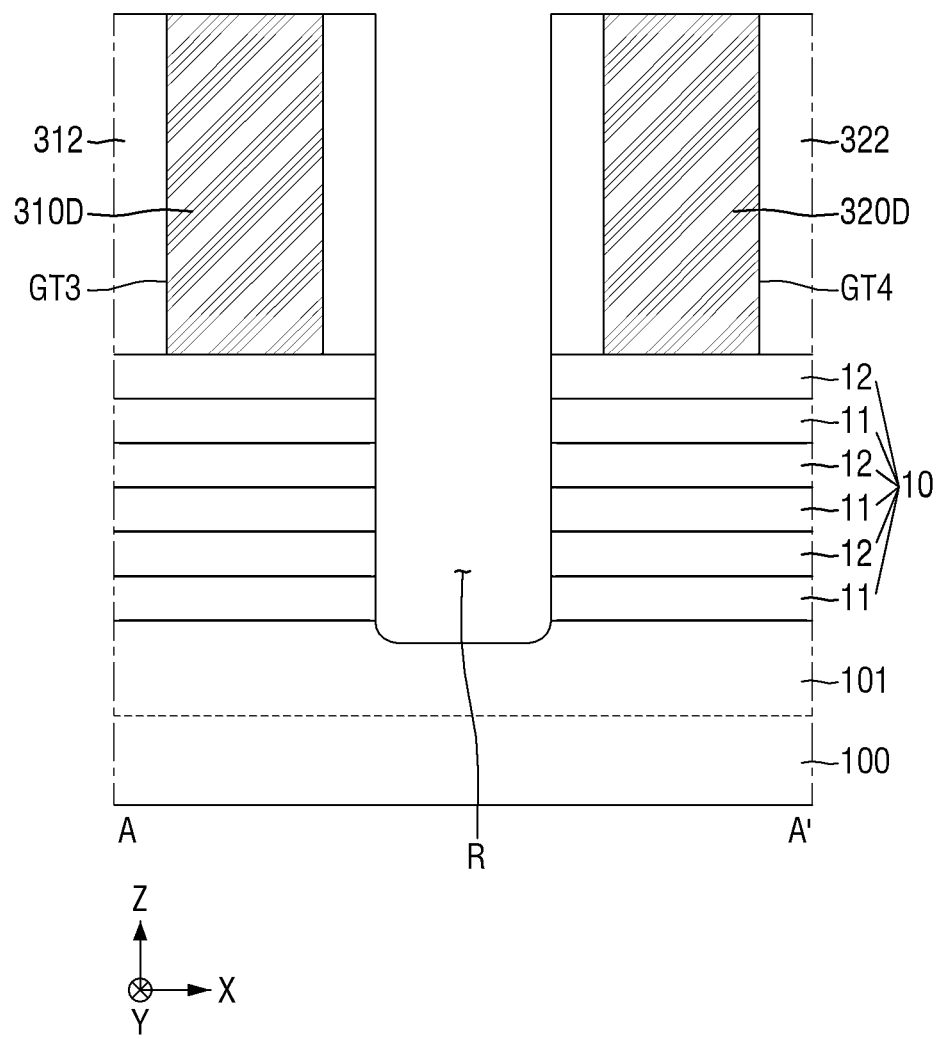
FIGS. 27 to 31 are diagrams illustrating intermediate steps of a method for fabricating a semiconductor device according to some example embodiments of inventive concepts.

Referring to FIG. 27, the active region I (in FIG. 1) may be defined by forming the element isolation region II (in FIG. 1) on the substrate 100. Subsequently, the first fin-type pattern 101 may be formed on the substrate 100, and may extend in the first horizontal direction X. Thereafter, a stacked structure 10, in which first semiconductor layers 11 and second semiconductor layers 12 are alternately stacked, may be formed on the first fin-type pattern 101.

Then, a first dummy gate 310D and a second dummy gate 320D may be formed above the first fin-type pattern 101 and the field insulating layer 105 (in FIG. 4), and may extend in the second horizontal direction Y. The second dummy gate 320D may be spaced apart from the first dummy gate 310D in the first horizontal direction X. The first gate spacers 312 may be formed along both sidewalls of the first dummy gate 310D, and the second gate spacers 322 may be formed along both sidewalls of the second dummy gate 320D.

Subsequently, a recess R may be formed by etching the stacked structure 10 using the first dummy gate 310D and the second dummy gate 320D as a mask.

Figure 28:
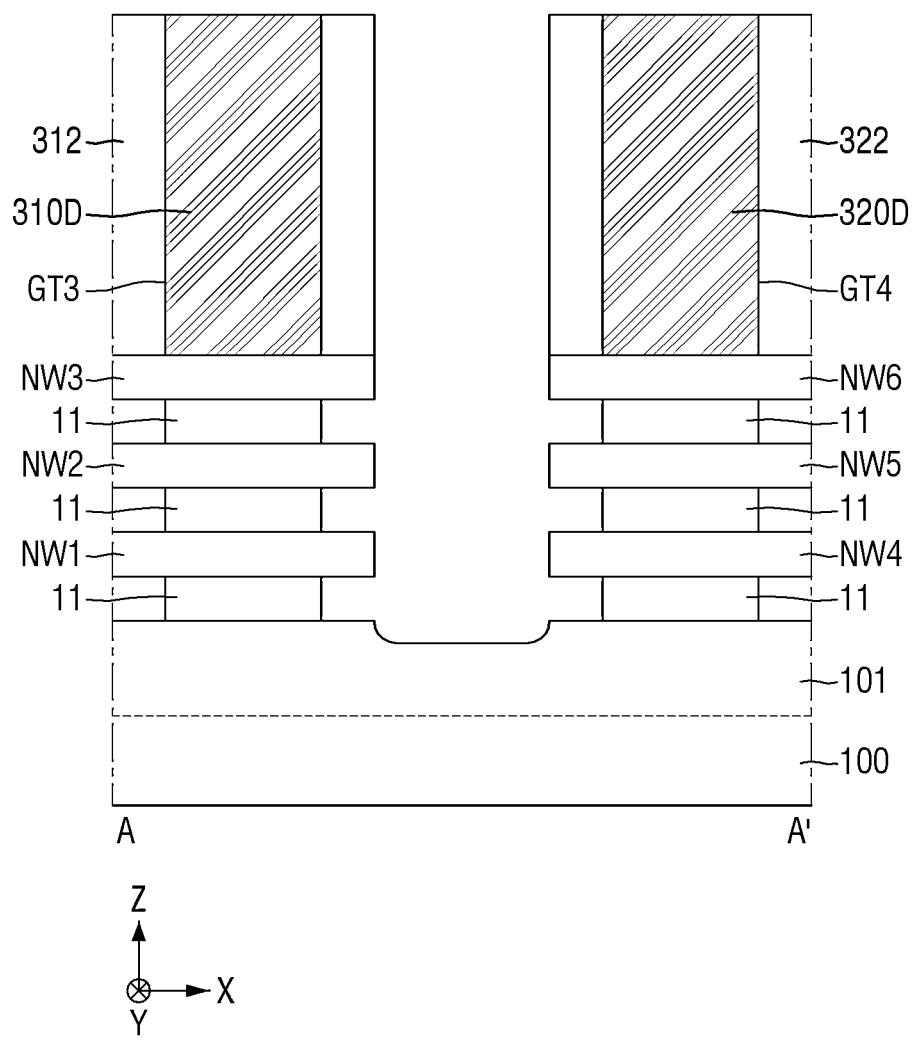

Referring to FIG. 28, the second semiconductor layers 12 etched under the first dummy gate 310D may be defined as first to third nanowires NW1, NW2, and NW3 that are sequentially stacked. Further, the second semiconductor layers 12 etched under the second dummy gate 320D may be defined as fourth to sixth nanowires NW4, NW5, and NW6 that are sequentially stacked. Each of the first semiconductor layers 11 exposed through the recess R may be partially etched.

Figure 29:
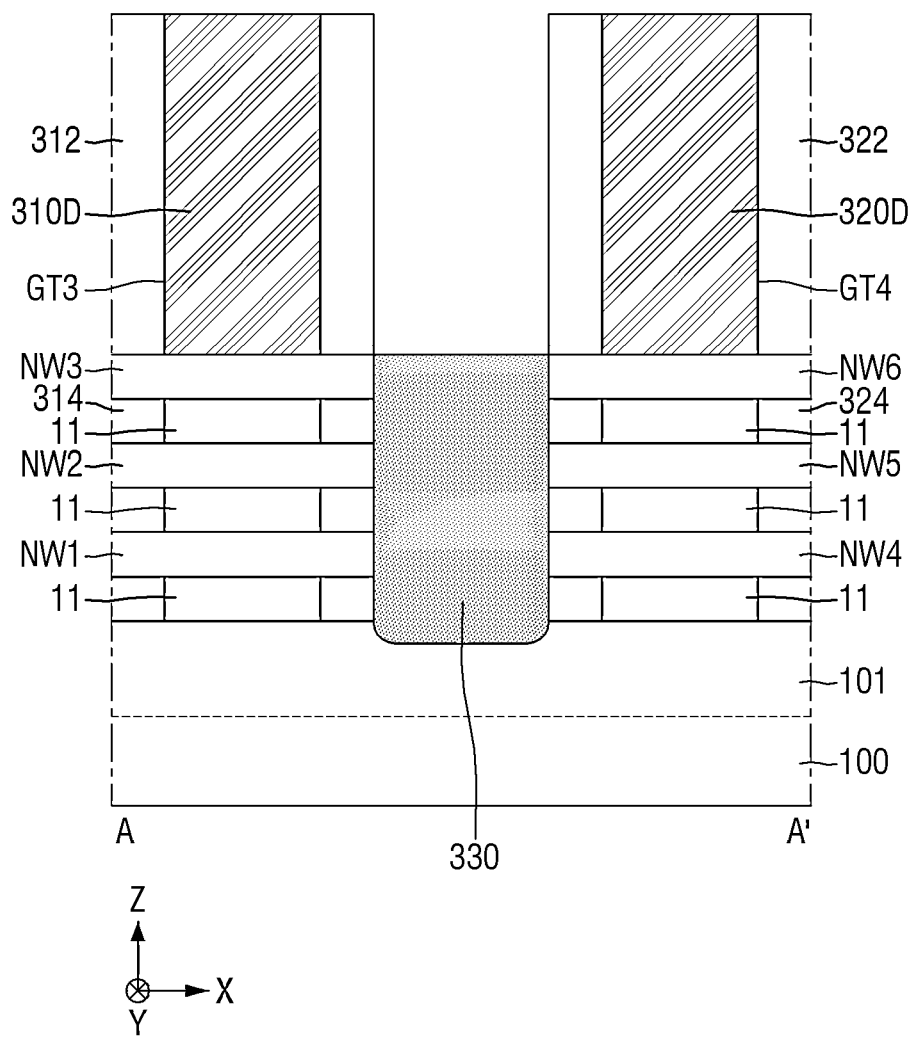
Figure 30:
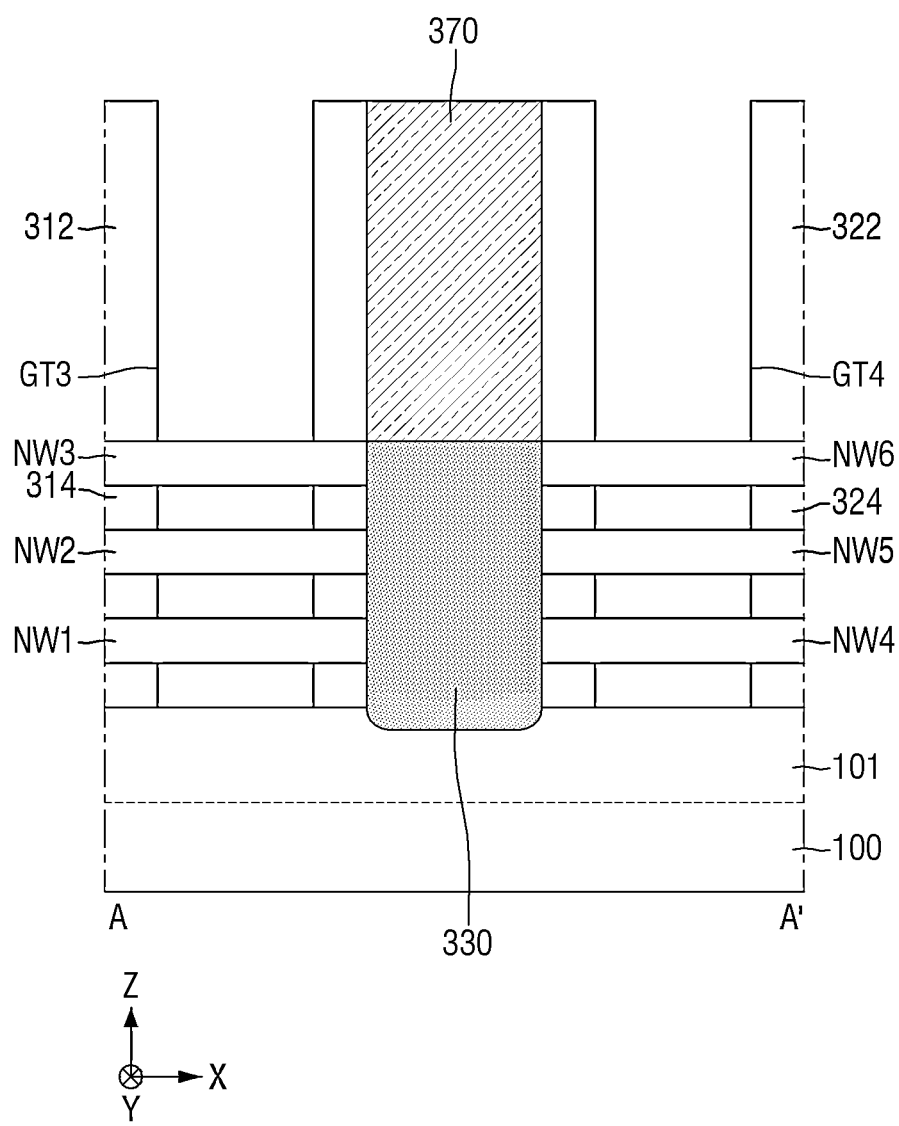

Referring now to FIGS. 29 and 30, the first internal spacers 314 may be formed in the portions where the first semiconductor layers 11 are etched under the first dummy gate 310D. In addition, the second internal spacers 324 may be formed in the portions where the first semiconductor layers 11 are etched under the second dummy gate 320D. Subsequently, the source/drain region 330 may be formed in the recess R.

Then, a first interlayer insulating layer 370 may be formed to cover the first dummy gate 310D, the second dummy gate 320D, the source/drain region 330 and the field insulating layer 105 (in FIG. 4). Thereafter, a planarization process (e.g., a CMP process and/or an etch-back process) may be performed to expose the top surfaces of the first dummy gate 310D and the second dummy gate 320D.

Subsequently, the first dummy gate 310D, the second dummy gate 320D, and the first semiconductor layers 11 may be removed.

Figure 31:
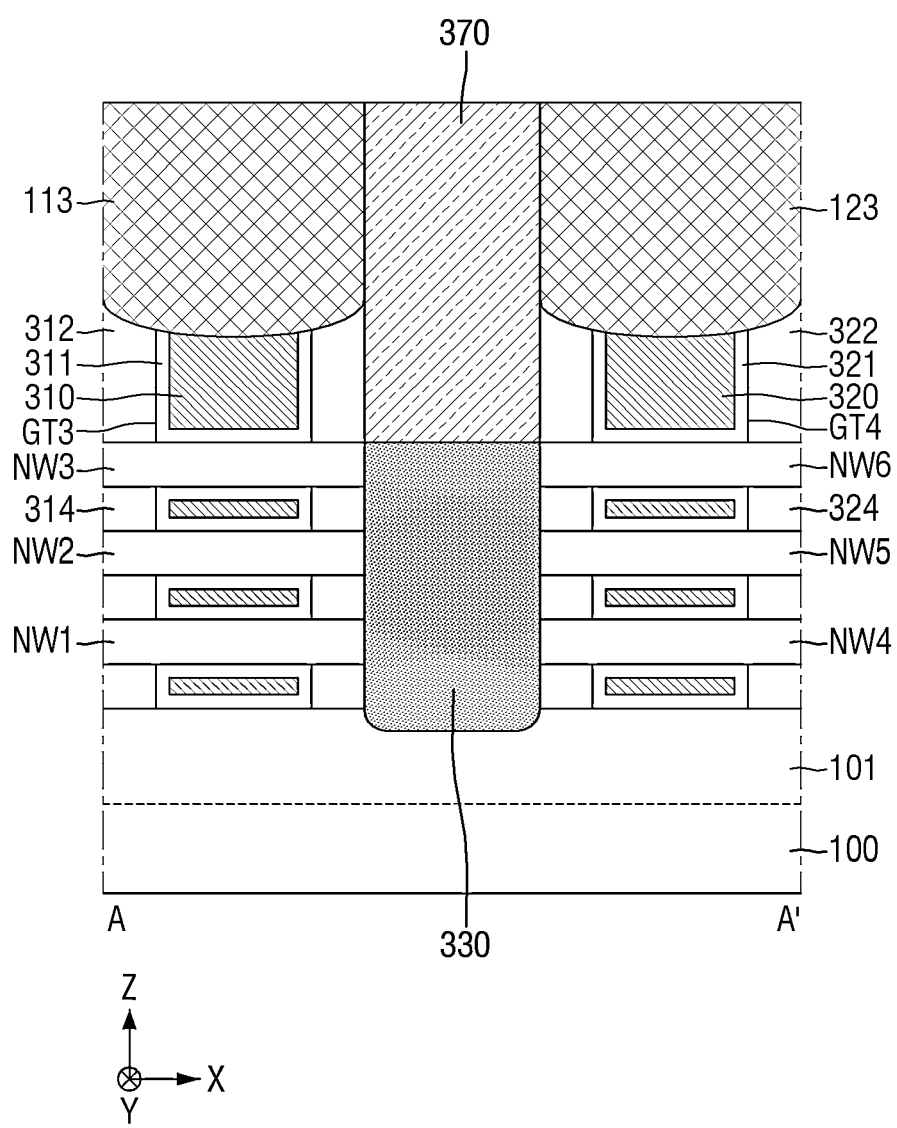

Referring to FIG. 31, the first capping pattern 113, the first gate electrodes 310, and the first gate insulating layers 311 may be formed in the portions from which the first dummy gate 310D and the first semiconductor layers 11 under the first dummy gate 310D have been removed. In addition, the second capping pattern 123, the second gate electrodes 320, and the second gate insulating layers 321 may be formed in the portions from which the second dummy gate 320D and the first semiconductor layers 11 under the second dummy gate 320D have been removed.

Thereafter, the semiconductor device illustrated in FIG. 19 may be fabricated through a fabricating process similar to the fabricating method illustrated in FIGS. 18 to 26.

As described herein, those of ordinary skill in the art will appreciate that many variations and modifications can be made to example embodiments without substantially departing from the principles of inventive concepts. Therefore, the disclosed example embodiments of inventive concepts are used in a generic and descriptive sense only and not for purposes of limitation.

What is claimed is:

1. A semiconductor device comprising:
a substrate comprising an element isolation region and an active region defined by the element isolation region;

a fin-type pattern on the active region, the fin-type pattern extending in a first horizontal direction;

a gate electrode on the fin-type pattern, the gate electrode extending in a second horizontal direction that crosses the first horizontal direction;

a capping pattern on the gate electrode;

a source/drain region on at least one side of the gate electrode;

a source/drain contact on the source/drain region and electrically connected to the source/drain region;

a gate contact penetrating the capping pattern and contacting the gate electrode; and a filling insulating layer on the source/drain contact, the filling insulating layer having a top surface at a same level as a top surface of the capping pattern and a top surface of the gate contact.

2. The semiconductor device of claim 1, further comprising:

an interlayer insulating layer surrounding each of a sidewall of the capping pattern and a sidewall of the filling insulating layer, the interlayer insulating layer having a topmost surface at the same level as the top surface of the filling insulating layer and including a material not among materials included in the filling insulating layer.

3. The semiconductor device of claim 2, wherein the interlayer insulating layer is between the gate electrode and the source/drain contact.

4. The semiconductor device of claim 1,
wherein the gate contact does not contact the filling insulating layer.

5. The semiconductor device of claim 1, wherein the source/drain contact comprises a first portion on the source/drain region and a second portion protruding from the first portion in a vertical direction, and the capping pattern and the filling insulating layer surround a sidewall of the second portion of the source/drain contact.

6. The semiconductor device of claim 5, wherein a sidewall of the first portion of the source/drain contact does not contact the filling insulating layer.

7. The semiconductor device of claim 1, wherein the top surface of the capping pattern on the active region is at the same level as the top surface of the capping pattern on the element isolation region.

8. The semiconductor device of claim 1, further comprising:

first and second nanowires on the active region, the first and second nanowires stacked vertically while being spaced apart from each other, the first and second nanowires extending in the first horizontal direction, wherein the gate electrode surrounds the first and second nanowires.

9. The semiconductor device of claim 1, further comprising:

an etch stop layer on the filling insulating layer and the capping pattern and in contact with each of the filling insulating layer and the capping pattern.

10. A method for fabricating a semiconductor device, comprising:

forming, on a substrate, an active region extending in a first horizontal direction and an element isolation region defining the active region;

forming, on the substrate, a dummy gate extending in a second horizontal direction that crosses the first horizontal direction;

forming a source/drain region on at least one side of the dummy gate;

forming a first interlayer insulating layer surrounding a sidewall of the dummy gate;

forming a gate trench by removing the dummy gate;

sequentially forming, in the gate trench, a gate electrode and a capping pattern;

forming a contact trench on the active region to penetrate the first interlayer insulating layer in a vertical direction and to expose the source/drain region;

forming a contact structure to fill the contact trench;

forming a source/drain contact comprising a first portion and a second portion, the second portion protruding in the vertical direction from the first portion, the forming the source/drain contact including etching a part of the contact structure;

forming a filling insulating layer to completely fill the contact trench, the filling insulating layer including a material different from that of the first interlayer insulating layer; and forming a gate contact penetrating the capping pattern and contacting the gate electrode, wherein a top surface of the filling insulating layer is at a same level as a top surface of the capping pattern and a top surface of the gate contact.

11. The method of claim 10, wherein the top surface of the filling insulating layer is at the same level as a topmost surface of the first interlayer insulating layer.

12. The method of claim 10, wherein the forming of the source/drain contact comprises etching a part of the capping pattern formed on each of the active region and the element isolation region, and a top surface of the capping pattern on the active region is at a same level as the top surface of the capping pattern on the element isolation region.

13. The method of claim 10, wherein the forming of the filling insulating layer comprises:

forming the filling insulating layer in the contact trench and on the top surface of the capping pattern; and etching the filling insulating layer through a first planarization process to expose the capping pattern.

14. The method of claim 10, wherein the forming of the gate contact comprises:

forming a second interlayer insulating layer on the capping pattern and on the filling insulating layer;

forming the gate contact to penetrate the second interlayer insulating layer in the vertical direction and the capping pattern in the vertical direction; and etching a part of the gate contact and the second interlayer insulating layer through a second planarization process to expose the capping pattern.

15. The method of claim 14, further comprising:

after performing the second planarization process, sequentially forming an etch stop layer and a third interlayer insulating layer, the etch stop layer and the third interlayer insulating layer on the filling insulating layer, the first interlayer insulating layer, and the capping pattern;

forming a first via to penetrate the etch stop layer and the third interlayer insulating layer in the vertical direction, the first via connected to the gate contact; and forming a second via to penetrate the etch stop layer and the third interlayer insulating layer in the vertical direction, the second via connected to the second portion of the source/drain contact.

16. The method of claim 10, wherein at least a part of the capping pattern is exposed through the contact trench.

17. The method of claim 10, wherein the forming of the dummy gate on the substrate comprises:

forming a stacked structure in which first and second semiconductor layers are alternately stacked, the stacked structure on the active region of the substrate; and forming the dummy gate on the stacked structure.

18. The method of claim 17, wherein the forming of the source/drain region on at least one side of the dummy gate comprises:

forming a recess by etching the stacked structure using the dummy gate as a mask;

etching a part of the first semiconductor layer exposed by the recess;

forming an internal spacer in a portion where the first semiconductor layer is etched; and forming the source/drain region in the recess.

19. A method for fabricating a semiconductor device, comprising:

forming, on a substrate, an active region extending in a first horizontal direction and an element isolation region defining the active region;

forming, on the substrate, a dummy gate extending in a second horizontal direction that crosses the first horizontal direction;

forming a source/drain region on at least one side of the dummy gate;

forming a first interlayer insulating layer surrounding a sidewall of the dummy gate;

forming a gate trench by removing the dummy gate;

sequentially forming a gate electrode in the gate trench and a capping pattern in the gate trench;

forming, on the active region, a contact trench to penetrate the first interlayer insulating layer in a vertical direction and to expose the source/drain region;

forming a contact structure to fill the contact trench;

forming a source/drain contact comprising a first portion and a second portion protruding in the vertical direction from the first portion by etching a part of the contact structure;

forming a filling insulating layer in the contact trench and on a top surface of the capping pattern;

etching the filling insulating layer through a first planarization process to expose the capping pattern;

forming a second interlayer insulating layer on the capping pattern and on the filling insulating layer;

forming, on the active region, a gate contact to penetrate the second interlayer insulating layer and the capping pattern in the vertical direction; and etching a part of the gate contact and the second interlayer insulating layer through a second planarization process to expose the capping pattern, wherein the filling insulating layer includes a material containing a carbon (C) atom, and a top surface of the filling insulating layer is at a same level as each of the top surface of the capping pattern and a top surface of the first interlayer insulating layer.

* * * * *